United States Patent
Kim et al.

(10) Patent No.: US 9,490,107 B2
(45) Date of Patent: Nov. 8, 2016

(54) PLASMA APPARATUS AND METHOD OF FABRICATING SEMICONDUCTOR DEVICE USING THE SAME

(71) Applicants: Moojin Kim, Suwon-si (KR); Bongseong Kim, Yongin-si (KR); DeogJa Koo, Yongin-si (KR); Je-Hun Woo, Suwon-si (KR); Unjoo Lee, Seoul (KR)

(72) Inventors: Moojin Kim, Suwon-si (KR); Bongseong Kim, Yongin-si (KR); DeogJa Koo, Yongin-si (KR); Je-Hun Woo, Suwon-si (KR); Unjoo Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/699,266

(22) Filed: Apr. 29, 2015

(65) Prior Publication Data
US 2015/0325413 A1   Nov. 12, 2015

(30) Foreign Application Priority Data
May 12, 2014 (KR) .......... 10-2014-0056641

(51) Int. Cl.
*H01J 37/30* (2006.01)
*H05H 1/26* (2006.01)
*H01J 37/32* (2006.01)

(52) U.S. Cl.
CPC .... *H01J 37/32715* (2013.01); *H01J 37/32082* (2013.01); *H01J 37/32449* (2013.01); *H01J 37/32706* (2013.01)

(58) Field of Classification Search
CPC .......... H01J 37/30; H01J 37/01; H01J 37/26; H01J 37/32155; H01J 37/32091
USPC ................. 315/111.21; 156/345.28, 345.34; 118/697
See application file for complete search history.

(56) References Cited

U.S. PATENT DOCUMENTS

| 5,770,023 A | 6/1998 | Sellers |
| 6,051,114 A | 4/2000 | Yao et al. |

(Continued)

FOREIGN PATENT DOCUMENTS

| JP | 1996-293539 | 11/1996 |
| JP | H08 293539 A | 11/1996 |

(Continued)

OTHER PUBLICATIONS

Silapunt et al, "Ion energy control at substrates during plasma etching of patterned Structures." J. Vac. Sci. Technol. B 25, 1882 (2007); doi: 10.1116/1.2803723.

(Continued)

*Primary Examiner* — Douglas W Owens
*Assistant Examiner* — Wei Chan
(74) *Attorney, Agent, or Firm* — Muir Patent Law, PLLC

(57) ABSTRACT

A plasma apparatus includes a process chamber having an inner space, a chuck disposed in the process chamber and having a top surface on which a substrate is loaded, a gas supply unit supplying a process gas into the process chamber, a plasma generating unit generating plasma over the chuck, and a direct current (DC) power generator applying a DC pulse signal to the chuck. A period of the DC pulse signal may include a negative pulse duration during which a negative pulse is applied, a positive pulse duration during which a positive pulse is applied, and a pulse-off duration during which the negative pulse and the positive pulse are turned off. The positive pulse duration is between the negative pulse duration and the pulse-off duration. The pulse-off duration may comprise a voltage having a lower magnitude than the voltage of the positive pulse, such as a ground voltage.

22 Claims, 23 Drawing Sheets

(56) References Cited

U.S. PATENT DOCUMENTS

| | | |
|---|---|---|
| 6,187,685 B1 | 2/2001 | Hopkins et al. |
| 6,818,103 B1 | 11/2004 | Scholl et al. |
| 7,572,737 B1 | 8/2009 | Dhindsa |
| 7,718,538 B2 | 5/2010 | Kim et al. |
| 7,886,690 B2 | 2/2011 | Ellingboe |
| 8,207,470 B2 | 6/2012 | Jeon et al. |
| 8,383,001 B2 | 2/2013 | Mochiki et al. |
| 8,426,317 B2 | 4/2013 | Koshimizu |
| 8,449,715 B2 | 5/2013 | Mitsuhashi et al. |
| 8,540,851 B2 | 9/2013 | Li et al. |
| 8,603,293 B2 | 12/2013 | Koshiishi et al. |
| 2001/0050220 A1* | 12/2001 | Chiang ............... C23C 14/352 204/192.12 |
| 2006/0066247 A1* | 3/2006 | Koshiishi ......... H01J 37/32018 315/111.21 |
| 2007/0000611 A1* | 1/2007 | Shannon .......... H01J 37/32165 156/345.28 |
| 2008/0289576 A1* | 11/2008 | Lee ................. H01J 37/32357 118/723 I |
| 2009/0242127 A1* | 10/2009 | Koshimizu ...... H01J 37/32091 156/345.28 |
| 2010/0027708 A1* | 2/2010 | Fukuda ............. H04L 25/4917 375/286 |
| 2010/0072172 A1* | 3/2010 | Ui .................... H01J 37/32009 216/67 |
| 2010/0203736 A1* | 8/2010 | Ichino .............. H01J 37/32091 438/710 |
| 2010/0252199 A1 | 10/2010 | Marakhtanov et al. |
| 2011/0094996 A1* | 4/2011 | Yamazawa .......... H01J 37/321 216/68 |
| 2011/0100807 A1* | 5/2011 | Matsubara ......... C23C 14/3464 204/298.08 |
| 2011/0115379 A1 | 5/2011 | Long et al. |
| 2011/0247995 A1* | 10/2011 | Takahashi ........ H01J 37/32082 216/22 |
| 2011/0318933 A1 | 12/2011 | Yatsuda et al. |
| 2012/0000421 A1 | 1/2012 | Miller et al. |
| 2012/0006351 A1* | 1/2012 | Jun ................... H01J 37/32862 134/1.1 |
| 2012/0171390 A1 | 7/2012 | Nauman et al. |
| 2012/0283973 A1 | 11/2012 | Samara et al. |
| 2013/0059448 A1* | 3/2013 | Marakhtanov .... H01J 37/32091 438/711 |
| 2013/0072013 A1 | 3/2013 | Chen et al. |
| 2013/0092529 A1 | 4/2013 | Singh et al. |
| 2013/0199727 A1 | 8/2013 | Iwata et al. |

FOREIGN PATENT DOCUMENTS

| | | |
|---|---|---|
| JP | 5281309 B2 | 9/2013 |
| JP | 5371466 | 12/2013 |
| KR | 2002-0057688 | 7/2002 |
| KR | 10-0384789 | 5/2003 |
| KR | 10-2006-0006261 | 1/2006 |
| KR | 10-0668956 | 1/2007 |
| KR | 10-2008-0060763 | 7/2008 |
| KR | 10-0986023 | 10/2010 |
| KR | 10-1027471 | 4/2011 |
| KR | 10-2013-0037986 | 4/2013 |
| KR | 10-2013-0058416 | 6/2013 |
| KR | 10-1328800 | 11/2013 |

OTHER PUBLICATIONS

Wang et al, "Control of ion energy distribution at substrates during plasma processing." J. Appl. Phys. 88, 643 (2000); doi: 10.1063/1.373715.

* cited by examiner

PLASMA APPARATUS AND METHOD OF FABRICATING SEMICONDUCTOR DEVICE USING THE SAME

CROSS-REFERENCE TO RELATED APPLICATION

This U.S. non-provisional patent application claims priority under 35 U.S.C. §119 to Korean Patent Application No. 10-2014-0056641, filed on May 12, 2014, in the Korean Intellectual Property Office, the disclosure of which is hereby incorporated by reference in its entirety.

BACKGROUND

Semiconductor devices are widely used in an electronic industry because of their small size, multi-function, and/or low fabrication costs. Semiconductor devices may be fabricated using various semiconductor fabricating processes such as deposition, ion implantation, photolithography, and etching. Some of the semiconductor fabricating processes may be performed using plasma. As semiconductor devices have been highly integrated, sizes of the patterns of semiconductor devices have been reduced. In addition, aspect ratios of the patterns have been increased. The size reduction and/or the increase in the aspect ratio of the patterns may cause various problems with semiconductor fabricating processes that use plasma.

SUMMARY

Embodiments of the inventive concepts may provide plasma apparatuses capable of effectively controlling various process factors.

Embodiments of the inventive concepts may also provide plasma apparatuses capable of improving reliability of semiconductor fabricating processes.

Embodiments of the inventive concepts may also provide methods of fabricating a semiconductor device using the plasma apparatus.

In one aspect, a plasma apparatus may include: a process chamber having an inner space; a chuck disposed in the process chamber, the chuck having a top surface on which a substrate is loaded; a gas supply unit supplying a process gas into the process chamber; a plasma generating unit generating plasma over the chuck; and a direct current (DC) power generator applying a DC pulse signal to the chuck. A period of the DC pulse signal may include: a negative pulse duration during which a negative pulse is applied; a positive pulse duration during which a positive pulse is applied; and a pulse-off duration during which the negative pulse and the positive pulse are turned off. The positive pulse duration may be between the negative pulse duration and the pulse-off duration.

In some embodiments, the period of the DC pulse signal may further include: a stable duration between the negative pulse duration and the positive pulse duration.

In some embodiments, a ground voltage may be applied to the chuck during the stable duration and the pulse-off duration.

In some embodiments, a length of the stable duration may be different from a length of the pulse-off duration.

In some embodiments, the pulse-off duration may be longer than the stable duration.

In some embodiments, a magnitude of the positive pulse may be less than a magnitude of the negative pulse.

In some embodiments, the negative pulse duration may be longer than the positive pulse duration.

In some embodiments, the DC power generator may include: a negative power supply generating the negative pulse; a positive power supply generating the positive pulse; and a pulse modulator controlling output times of the negative pulse and the positive pulse to output the DC pulse signal.

In some embodiments, the DC power generator may further include: a ground source generating a ground voltage; and a controller controlling the negative power supply, the positive power supply, and the pulse modulator.

In some embodiments, the pulse modulator may include: a first switch having a first terminal connected to the negative power supply; a second switch having a first terminal connected to the positive power supply; a third switch having a first terminal connected to the ground source; and an output terminal connected to second terminals of the first, second and third switches. The first, second and third switches may operate in response to first, second and third control signals received from the controller.

In some embodiments, the plasma apparatus may further include: an outer ring disposed on an edge of the chuck and surrounding the loaded substrate. The outer ring may be supplied with a second DC pulse signal.

In some embodiments, the second DC pulse signal may have the same period as the DC pulse signal applied to the chuck.

In some embodiments, the chuck may include: at least one conductive pin disposed within the chuck. The at least one conductive pin may be in contact with the loaded substrate, and the DC power generator may be electrically connected to the at least one conductive pin.

In another aspect, a plasma apparatus may include: a process chamber having an inner space; a chuck disposed in the process chamber, the chuck having a top surface on which a substrate is loaded; an outer ring disposed on an edge of the chuck, the outer ring configured to surround the loaded substrate; a gas supply unit supplying a process gas into the process chamber; a plasma generating unit generating plasma over the chuck; and a direct current (DC) power generating unit applying a first DC pulse signal to the chuck and a second DC pulse signal to the outer ring.

In some embodiments, the first DC pulse signal may have the same period as the second DC pulse signal, and the second DC pulse signal may be synchronized with the first DC pulse signal.

In some embodiments, a period of the first and second DC pulse signals may include: a negative pulse duration; a positive pulse duration; and a pulse-off duration. The first DC pulse signal and the second DC pulse signal may transfer a first negative pulse and a second negative pulse to the chuck and the outer ring during the negative pulse duration, respectively. The first DC pulse signal and the second DC pulse signal may transfer a first positive pulse and a second positive pulse to the chuck and the outer ring during the positive pulse duration, respectively. The first and second negative pulses and the first and second positive pulses may be turned off during the pulse-off duration.

In still another aspect, a method of fabricating a semiconductor device may include: loading a substrate having an etch target layer on a chuck disposed in a process chamber; generating plasma over the loaded substrate; and etching a portion of the etch target layer using a direct current (DC) pulse signal applied to the chuck. A period of the DC pulse signal may include: a negative pulse duration during which a negative pulse is applied; a positive pulse duration during which a positive pulse is applied; and a pulse-off duration during which the negative pulse and the positive pulse are turned off. The positive pulse duration may be between the negative pulse duration and the pulse-off duration.

In some embodiments, the DC pulse signal may further include: a stable duration between the negative pulse duration and the positive pulse duration. A ground voltage may be applied to the chuck during the stable duration and the pulse-off duration, and a length of the stable duration may be different from a length of the pulse-off duration.

In some embodiments, the etch target layer may include first layers and second layers alternately and repeatedly stacked on the substrate.

In some embodiments, the method may further include: forming a mold layer on the substrate before the formation of the etch target layer; and patterning the mold layer to form a hole. The etch target layer may be conformally formed on an inner surface of the hole.

In some embodiments a method of manufacturing, may comprise providing a substrate in a chamber, the substrate including a target layer and a mask with openings on the target layer; generating a plasma in the chamber including ions; during first periods of time, accelerating the ions to the substrate to cause portions of the target layer exposed by the openings of the mask to be etched and to create a resultant etch byproduct; during second periods of time that are each between corresponding ones of the first periods of time, increasing an electron temperature of the plasma to increase the formation of radicals deposited on the mask surface.

The substrate may be provided on a chuck in the chamber, wherein during the first periods of time a first potential may be applied to the chuck. The first potential may be a negative potential.

In some embodiments, during the second periods of time a second potential, higher than the first potential, is applied to the chuck.

During the second periods of time a third potential, lower than the second potential and higher than the first potential, may be applied to the chuck.

The second potential may be a positive potential and the third potential is within a range of −500V to +500V.

The third potential may be within the range of −100V to 100V.

The third potential may be substantially a ground potential.

In some embodiments, a pulse of negative potential is applied to the chuck throughout each of the first periods of time. One or more potentials each higher than the negative potential may be applied to the chuck throughout each of the second periods of time.

In some embodiments, a method of manufacturing, comprises providing a substrate on a chuck in a chamber, the substrate including a target layer and a mask with openings on the target layer; generating a plasma in the chamber including etchant ions; and repetitively applying a DC potential signal to the chuck, the DC potential signal consisting of a first portion and a second portion. The first portion may be negative to accelerate the etchant ions to the substrate to cause portions of the target layer exposed by the openings of the mask to be etched and to create a resultant etch byproduct; and the second portion may have a higher potential than the first portion to cause the etch byproduct to be deposited on the mask surface.

The first portion may consist of a negative potential pulse.

The second portion may comprise a positive potential pulse and a part having a potential lower than the positive potential pulse. The potential lower than the positive potential pulse may in the range of −500 V to +500 V.

The potential lower than the positive potential pulse may be substantially a ground potential.

The DC potential signal may be repetitively applied at a rate within the range of 100 Hz to 300 Hz.

The second portion may be longer in time than the first portion.

The second portion may consist of a first part, followed by a second part followed by a third part, the second part comprising a positive potential pulse, and the first part and the third part having a lower potential than the positive potential pulse.

The first and third parts of the second portion may be substantially a ground potential. The first part may be shorter in time than the third part.

The etchant may comprise fluorine and the radicals may comprise at least one of CF and CF2.

In some embodiments, a plasma apparatus comprises a process chamber configured to maintain a plasma; a chuck within the process chamber, the chuck comprising a surface configured to mount a wafer; one or more electrodes configured to generate plasma within the chamber; and a DC voltage generator configured to repetitively generate a first DC signal and apply the first DC signal to the chuck, the first DC signal consisting of a first portion and a second portion, wherein the first portion consists of a DC signal that is not greater than −500V, wherein the second portion consists of a DC signal that is equal to or greater than about a ground potential, wherein a duration of the second portion is greater than a duration of the first portion.

The second portion may comprise a positive potential pulse portion and a ground potential portion. The first portion may consist of a negative potential pulse.

The second portion may comprise a positive potential pulse and a part having a potential lower than the positive potential pulse. The potential lower than the positive potential pulse may be in the range of −500 V to +500 V.

The potential lower than the positive potential pulse may be substantially a ground potential. The DC voltage generator may be configured to repetitively apply the DC potential signal at a rate within the range of 100 Hz to 300 Hz.

The second portion is may have a longer duration than the first portion.

The second portion may consist of a first part, followed by a second part followed by a third part, the second part comprising a positive potential pulse, and the first part and the third part having a lower potential than the positive potential pulse.

The plasma apparatus may also comprise a ring comprising a conductive material disposed near a top surface of the chuck to surround the surface configured to mount the wafer.

The DC voltage generator may be configured to repetitively generate a second DC signal and to apply the second DC potential signal to the ring, the second DC signal being generated in synchronism with the first DC signal.

The second DC signal may comprise different potential magnitudes than the first DC signal.

The second DC signal may comprise of a third portion and a fourth portion, wherein the third portion consists of a negative pulse, and wherein the fourth portion consists of a DC signal that is equal to or greater than about a ground potential.

The first and second DC signals may have waveforms that are substantially the same shape but having different magnitudes for at least some portions of the first and second DC signals.

The fourth portion may comprise a positive potential pulse portion and a ground potential portion, and the magnitude of the positive potential pulse portion of the fourth portion may be different from the magnitude of the positive potential pulse portion of the second portion.

The first potential and the third potential may be negative pulses having different magnitudes from each other.

DETAILED DESCRIPTION OF THE EMBODIMENTS

Figure 1:
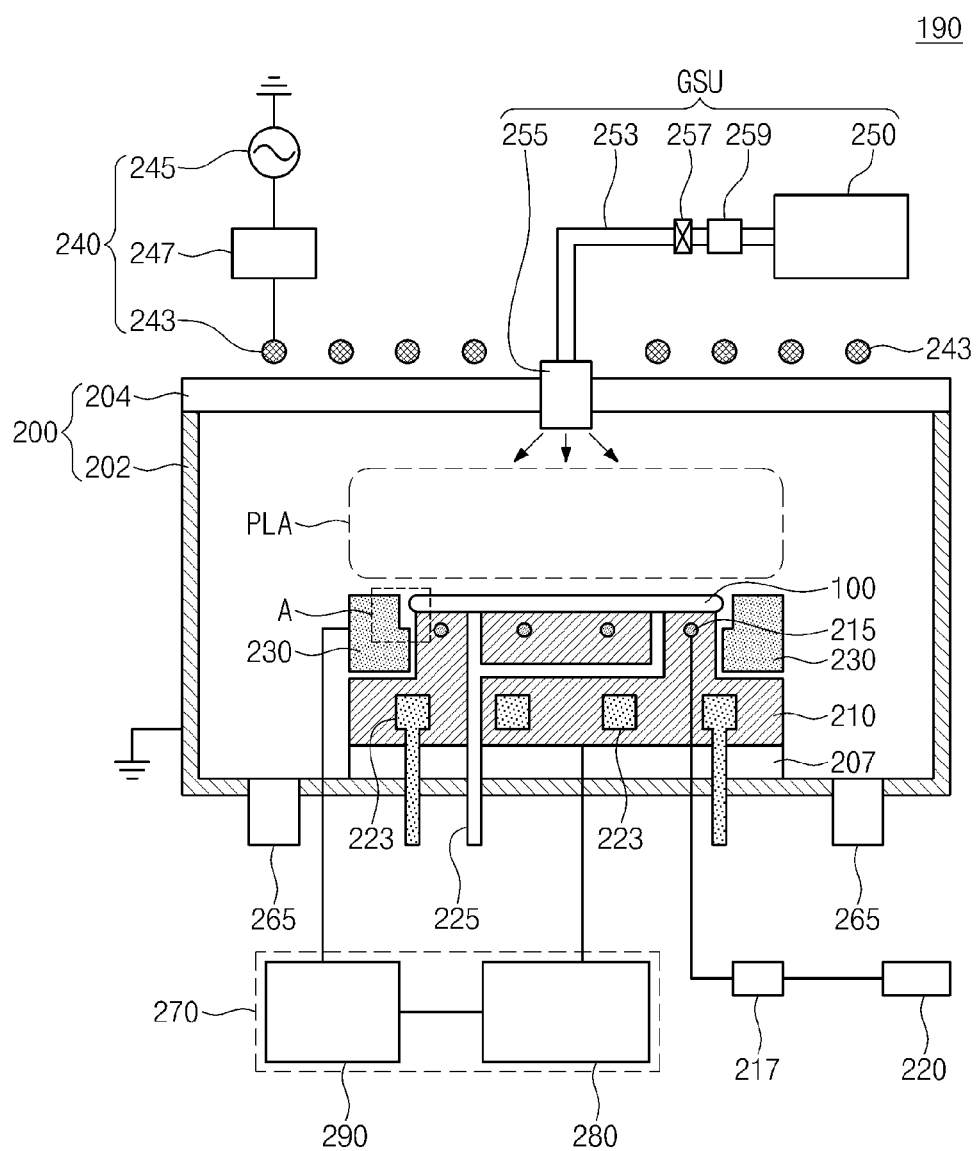
FIG. 1 is a schematic diagram illustrating a plasma apparatus according to some embodiments of the inventive concepts.

The inventive concepts will now be described more fully hereinafter with reference to the accompanying drawings, in which example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be also understood that although the terms "first," "second," "third," etc. may be used herein to describe various elements, these elements should not be limited by these terms. These terms are only used to distinguish one element from another element. Thus, a first element referenced in some embodiments could be referred to a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that may be idealized exemplary illustrations. Accordingly, deviations from the shapes in the illustrations as a result, for example, of manufacturing techniques and/or tolerances, are to be expected. For example, an etching region illustrated as a rectangle will, typically, have rounded or curved features. Thus, the regions illustrated in the figures may be schematic in nature and their shapes may not illustrate the actual shape of a region of a device.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a schematic diagram illustrating a plasma apparatus according to some embodiments of the inventive concepts.

Referring to FIG. 1, a plasma apparatus 190 may include a process chamber 200 having an inner enclosed space, a chuck 210, a gas supply unit GSU, a plasma generating unit 240, and a direct current (DC) power generating unit 270.

In some embodiments, the process chamber 200 may include a container 202 defining the inner space and a top plate 204 covering a top end of the container 202. The container 202 may include a chamber wall portion and a chamber bottom portion. In some embodiments, the top plate 204 may be formed of ceramic.

The chuck 210 may be disposed within the process chamber 200. The substrate 100 may be loaded on a top surface of the chuck 210. A predetermined semiconductor process may be performed on the loaded substrate 100 within the process chamber 200. The substrate 100 may be, for example, a semiconductor wafer (e.g., a silicon wafer). In some embodiments, the chuck 210 may be an electrostatic chuck. The chuck 210 may be disposed on the chamber bottom portion of the container 202. An insulator 207 may be disposed between the chuck 210 and the chamber bottom portion to insulate the chuck 210 from the container 202.

A heater 215 may be disposed within the chuck 210. The heater 215 may provide heat to the chuck 210 and/or the loaded substrate 100 to raise and/or maintain a target (e.g., predetermined) temperature of the chuck 210 or loaded substrate 100. A heater power generator 220 may provide power to the heater 215, so the heater 215 may generate heat. The power provided to the heater 215 by heater power generator 220 may be an alternating current (AC) power. A heater filter 217 may be connected between the heater 215 and the heater power generator 220.

A chuck cooler 223 may be disposed within the chuck 210. A coolant may be provided into the chuck cooler 223 to cool the chuck 210. A temperature of the chuck 210 may be controlled using the chuck cooler 223 and the heater 215.

A substrate cooling pipe 225 may be disposed in the chuck 210. A cooling gas may be provided to a back side of the loaded substrate 100 through the substrate cooling pipe 225. The loaded substrate 100 may be maintained at a constant temperature by the cooling gas. For example, the cooling gas may be a helium (He) gas.

At least a portion of the chuck 210 may be formed of a conductive material, and the conductive portion of the chuck 210 may be used as an electrode. The DC power generating unit 270 is electrically connected to the conductive portion, which is used as the electrode, of the chuck 210. The DC power generating unit 270 will be described in more detail later.

The outer ring 230 may be disposed at an edge of the chuck 210. The outer ring 230 may surround the loaded substrate 100. The outer ring 230 may protect the loaded substrate 100. The outer ring 230 may be adjacent to an edge of the loaded substrate 100.

The gas supply unit GSU provides a process gas into the process chamber 200. In some embodiments, the gas supply unit GSU may include a gas storage part 250 storing the process gas, a gas supply port 255 coupled to the process chamber 200, and a gas supply pipe 253 connected between the gas storage part 250 and the gas supply port 255. In some embodiments, the gas supply port 255 may penetrate the top plate 204 of the process chamber 200. The gas supply port 255 may have a nozzle shape or shower-head shape toward the inner space of the process chamber 200. The gas supply unit GSU may further include at least one of a valve 257 and a gas flow controller 259 that are installed on the gas supply pipe 253.

The plasma generating unit 240 may convert the process gas provided in the process chamber 200 into plasma PLA. In some embodiments, the plasma generating unit 240 may include a plasma power generator 245 and an antenna electrode 243 connected to the plasma power generator 245. The plasma power generator 245 may generate and apply power to the antenna electrode 243. The power may have a radio frequency (RF) power, for example. The antenna electrode 243 may have a closed-loop shape or a coil shape. The plasma PLA may be created as a result of the power applied to the antenna electrode 243. The plasma PLA may comprise ions, radicals and electrons. In addition, the plasma generating unit 240 may further include a matching unit 247 connected between the plasma power generator 245 and the antenna electrode 243. Power may be transmitted from the plasma power generator 245 to the antenna electrode 243 through the matching unit 247. The matching unit 247 may increase transmission efficiency of the plasma power. However, the inventive concepts are not limited to the aforementioned structure of the plasma generating unit 240 and the plasma generating unit 240 may be formed to have other structures.

An exhaust port 265 may be installed at the chamber bottom portion of the container 202. By-products and/or residue of the process gas that are used or are generated during the predetermined semiconductor process may be exhausted through the exhaust port 265. The exhaust port 265 may be connected to an exhaust pump (not shown).

The DC power generating unit 270 provides the chuck 210 with a first DC pulse signal having a specific period. The first DC pulse signal will be described in more detail with reference to FIG. 2.

Figure 2:
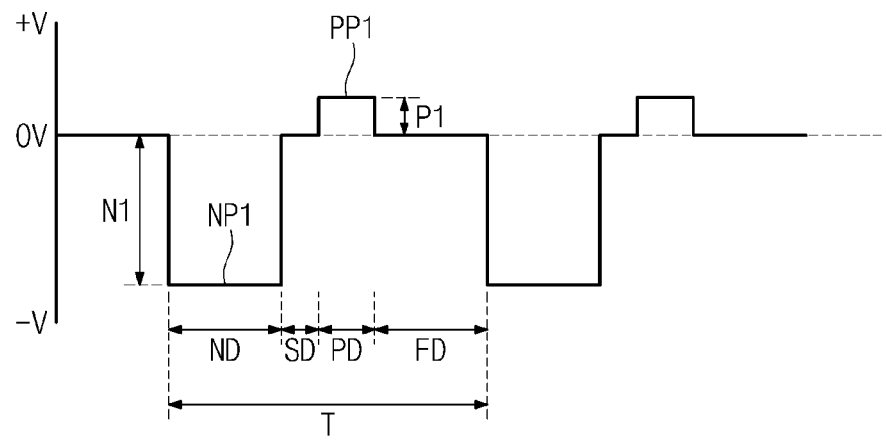
FIG. 2 is a graph illustrating a first direct current (DC) pulse signal that may be applied to a chuck included in a plasma apparatus, such as the plasma apparatus of FIG. 1.

FIG. 2 is a graph illustrating a first direct current (DC) pulse signal that may be applied to a chuck, such as chuck 210 included in the plasma apparatus of FIG. 1. A period T of the first DC pulse signal may include a negative pulse duration ND during which a first negative pulse NP1 is applied, a positive pulse duration PD during which a first positive pulse PP1 is applied, and a pulse-off duration FD during which neither the first negative pulse NP1 nor the first positive pulse PP1 are applied (in some embodiments, no pulse is applied during the pulse-off duration FD, in other embodiments, other pulse(s) may be applied, such as those that are relatively smaller than the first negative pulse NP1 and/or first positive pulse PP1). The positive pulse duration PD is between the negative pulse duration ND and the pulse-off duration FD. In addition, the period T of the first DC pulse signal may further include a stable duration SD between the negative pulse duration ND and the positive pulse duration PD. A ground voltage (i.e., 0V) may be applied to the chuck 210 during the stable duration SD and the pulse-off duration FD. In some embodiments, the period T of the first DC pulse signal may be in a range of 100 Hz to 300 kHz.

In some embodiments, the plasma apparatus 190 may be a dry etching apparatus. However, the inventive concepts are not limited thereto. In other embodiments, the plasma apparatus 190 may be one of other kinds of semiconductor apparatuses using the plasma PLA. Hereinafter, the plasma apparatus 190 will be described as a dry etching apparatus for convenience of explanation.

The first negative pulse NP1 is applied to the chuck 210 during the negative pulse duration ND. As a result, positive ions of the plasma PLA are attracted to the substrate 100 (and chuck 210) and formed on substrate 100. In this case, the substrate 100 may be charged by the positive ions. The ground voltage may be applied to the chuck 210 during the stable duration SD, and thus, the plasma PLA and the positive ions may be stabilized during the stable duration SD. The first positive pulse PP1 is applied to the chuck 210 during the positive pulse duration PD following the stable duration SD. Electrons and negative ions of the plasma PLA may be are attracted to the substrate 100 (and chuck 210) and formed on substrate 100 as a result of the first positive pulse PP1. Thus, the charged substrate 100 may be neutralized. As the negative ions and/or electrons of the plasma PLA are attracted and attach to the substrate, the charge of the substrate 100 may be made less positive than it was during the stable duration SD, which may be substantially neutral, positive but less positive, or negative. In addition, an electron temperature of the plasma PLA may be increased by removal of the electrons from the plasma. Also, radicals may be increased in the plasma PLA as a result of the increased electron temperature, and thus, an etch rate and an etch selectivity ratio between materials may be increased.

Characteristics of the radicals may be controlled during the pulse-off duration FD. In some embodiments, the radicals may combine with portions of the substrate to generate etch by-products causing a passivation effect during the pulse-off duration FD. For example, etch by-products may be formed when radicals of the plasma PLA combine with the target material, such as within a via or contact hole of the substrate 100. During the pulse-of duration FD, these etch by-products may escape the via or contact hole of the substrate 100 and be deposited on the upper surface of the substrate 100, which may comprise the upper surface of an etch mask used to etch a pattern into a target layer under the mask. Since the etch by-products may protect a component used as an etch mask during an etching process, a process margin of the etching process may be improved. In some embodiments, the amount of the etch by-products may increase in proportion to an increase in a length of the pulse-off duration FD. However, the inventive concepts are not limited thereto. In other embodiments, the amount of the etch by-products may be substantially constant during the pulse-off duration FD.

Additionally, when an etch region (such as a via or contact hole) having a significant aspect ratio is etched, etch by-products generated in the etch region may effectively escape from the via/contact hole/etch region during the pulse-off duration FD. The etch by-products generated in the via/contact hole/etch region may deteriorate a quality of the etching process and/or a profile of the via/contact hole/etch region. However, since the etch by-products generated in the via/contact hole/etch region are provided an opportunity to escape from the via/contact hole/etch region during the pulse-off duration FD, due to a reduced amount of etch by-products in the etch region during a subsequent cycle (e.g., during the next negative pulse duration ND) an etch rate may be increased and/or the via/contact hole/etch region having more accurate profile may be formed.

A magnitude N1 of the first negative pulse NP1 may be different from a magnitude P1 of the first positive pulse PP1. In some embodiments, the magnitude P1 of the first positive pulse PP1 may be less than the magnitude N1 of the first negative pulse NP1. For example, the magnitude P1 of the first positive pulse PP1 may be in a range of 0.1% to 30% of the magnitude N1 of the first negative pulse NP1. In particular, the magnitude P1 of the first positive pulse PP1 may be in a range of 1% to 10% of the magnitude N1 of the first negative pulse NP1. In some embodiments, the magnitude N1 of the first negative pulse NP1 may be in a range of 50 V to 10 kV, and the magnitude P1 of the first positive pulse PP1 may be in a range of 20 V to 2 kV. In addition, it is also possible that the voltage(s) applied during the stable duration SD and/or pulse off duration FD are a value other than ground and may range from negative 500V to positive 500V, for example, or, as another example, from negative 100V to positive 100V. The voltage applied during the stable duration SD and the voltage applied during pulse off duration FD may be less positive than the first positive pulse PP1. The voltage applied during the stable duration SD and the voltage applied during pulse off duration FD may be lesser in magnitude than the magnitude of the first negative pulse NP1. The negative duration may be less than the duration of the period T minus the negative duration (e.g., ND<SD+PD+FD). In addition, the negative duration ND may be less than the pulse off duration FD (i.e., ND<FD). A length of the first negative pulse duration ND may be different from a length of the first positive pulse duration PD. In some embodiments, the first negative pulse duration ND may be longer than the first positive pulse duration PD. In some embodiments, the length of the first negative pulse duration ND may be in a range of 1 μs to 200 μs, and the length of the first positive pulse duration PD may be in a range of 1 μs to 150 μs.

A length of the pulse-off duration FD may be different from a length of the stable duration SD. In some embodiments, the pulse-off duration FD may be longer than the stable duration SD, such as more than twice as long, more than three times as long, more than ten times as long or even more than 100 times as long. Alternatively, the pulse-off duration FD may be shorter than the stable duration SD. In some embodiments, the length of the stable duration SD may be a range of 1 μs to 30 μs, and the length of the pulse-off duration FD may be a range of 100 ns to 9.5 ms.

As described above, the period T of the first DC pulse signal applied to the chuck 210 includes the negative pulse duration ND, the positive pulse duration PD, and the pulse-off duration FD. The charged substrate 100 may be neutralized or have its charge reduced by the first positive pulse PP1 during the positive pulse duration PD. In addition, the first positive pulse of the positive pulse duration PD may increase the electron temperature, so radicals of the plasma PLA may be increased. Thus, the etch rate may be increased and/or the etch selectivity ratio may be increased (e.g., an etch selectivity ratio of an etch rate of a target layer that is the target of the etch process to an etch rate of a mask on the target layer or a layer exposed to the etchant that is not the target layer). Moreover, the characteristics of the radicals may be controlled during the pulse-off duration FD.

Experiments were performed to confirm effects obtained by the first DC pulse signal. In a first experiment, the length of the negative pulse duration ND was 120 μs, the magnitude of the first negative pulse was 560V. The length of the positive pulse duration PD was 40 µs, and the magnitude of the first positive pulse was 100V. When the positive pulse duration PD was not applied, an electron temperature was about 2.3 eV. Alternatively, when the positive pulse duration PD was applied, an electron temperature was about 2.6 eV. The electron temperature was increased by application of the first positive pulse during the positive pulse duration PD.

In a second experiment, a first sample and a second sample were prepared. The first sample was applied with the first positive pulse PP1 of 300V during the positive pulse duration of 40 µs. The second sample did not have the first positive pulse PP1 applied. An etch selectivity ratio of an oxide to poly-silicon was about 2.8 in the first sample. However, an etch selectivity ratio of an oxide to poly-silicon was about 2.5 in the second sample. Thus, the etch selectivity ratio was increased by the first positive pulse PP1 by 12%. In addition, an etch rate of the oxide of the first sample was about 1290 Å/min, and an etch rate of the oxide of the second sample was about 932 Å/min, an increase of about 38%. Thus, the etch rate is also increased by the positive pulse PP1. In this example, etch selectivity may be increased by 10% or more, and an etch rate can be increase by 25% or more, such as 35% or more.

Referring again to FIG. 1, the DC power generating unit 270 may include a first DC power generator 280 applying the first DC pulse signal to the chuck 210. In addition, the DC power generating unit 270 may further include a second DC power generator 290 applying a second DC pulse signal to the outer ring 230. The second DC power generator 290 and the second DC pulse signal will be described in detail below.

Figure 3:
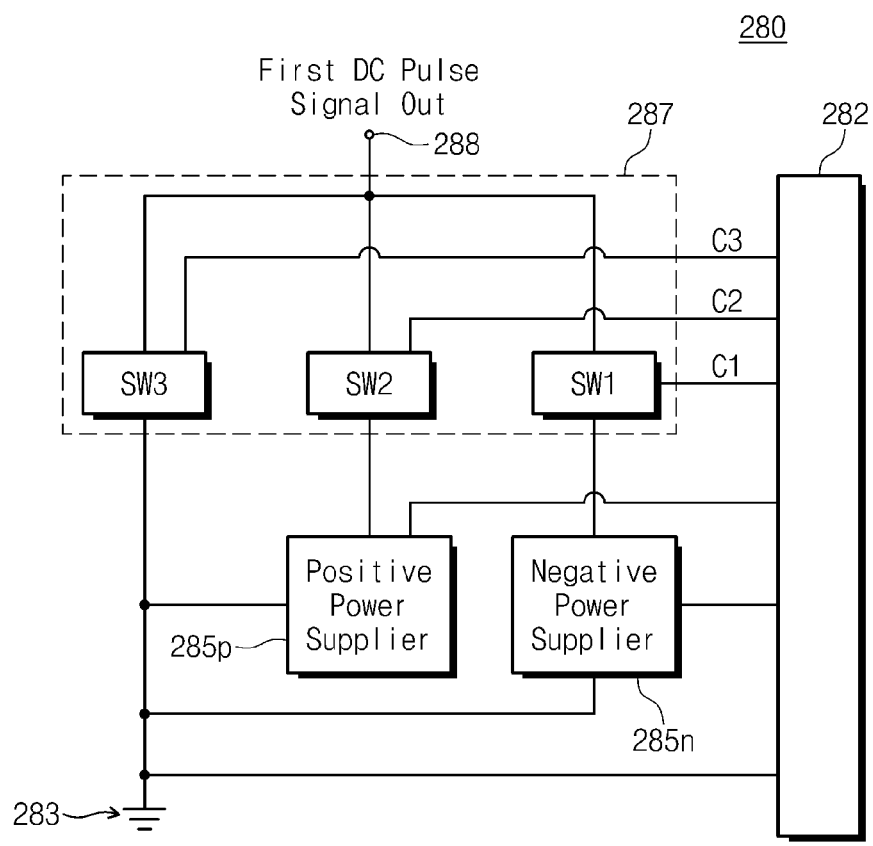
FIG. 3 is a schematic diagram illustrating an embodiment of a first DC power generator that may be in the plasma apparatus of FIG. 1.

An embodiment of the first DC power generator 280 will be described in detail with reference to FIG. 3. FIG. 3 is a schematic diagram illustrating an embodiment of the first DC power generator included in the plasma apparatus of FIG. 1.

Referring to FIGS. 1, 2, and 3, the first DC power generator 280 includes a first negative power supply 285n generating the first negative pulse NP1 and a first positive power supply 285p generating the first positive pulse PP1. The first positive power supply 285p is operated independently of the first negative power supply 285n. The first DC power generator 280 further includes a first pulse modulator 287 controlling output times of the first negative pulse NP1 and the first positive pulse PP1. In addition, the first DC power generator 280 may further include a first ground source 283 and a first controller 282. The first ground source 283 may generate the ground voltage, and the first controllers 282 may control operations of the supplies 285n and 285p and the first pulse modulator 287.

In some embodiments, the first pulse modulator 287 may include first, second and third switches SW1, SW2 and SW3. First terminals of the first, second, and third switches SW1, SW2 and SW3 may be connected to the first negative power supply 285n, the first positive power supply 285p, and the first ground source 283, respectively. Second terminals of the first, second and third switches SW1, SW2, and SW3 may be each connected to an output terminal 288 of the first pulse modulator 287. The first controller 282 may provide the first, second and third switches SW1, SW2 and SW3 with first, second and third control signals C1, C2 and C3 to output the first DC pulse signal through the output terminals 288. An operating method of the first DC power generator 280 will be described in more detail with reference to FIG. 4.

Figure 4:
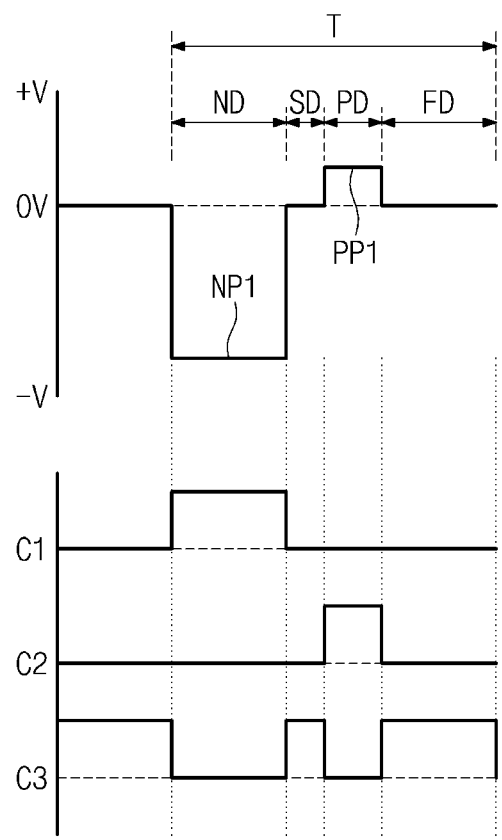
FIG. 4 is a timing diagram illustrating an exemplary operation of the first DC power generator of FIG. 3.

FIG. 4 is a timing diagram illustrating operation of the first DC power generator of FIG. 3.

Referring to FIGS. 1 to 4, the first negative power supply 285n may continuously generate and output a DC voltage having a magnitude equal to that of the first negative pulse NP1. The first positive power supply 285p may continuously generate and output a DC voltage having a magnitude equal to that of the first positive pulse PP1. Of course, the first negative power supply 285n and first positive power supply 285p may have their voltage generation subject to variations, such as by noise generated by fluctuations in power input or disruptions due to switching their outputs (e.g., connecting and disconnecting their output DC voltages to/from chuck 210 by switches SW1 and SW2).

The first controller 282 provides the first control signal C1 with an active state to the first switch SW1 during the negative pulse duration ND, and as a result, the first switch SW1 is turned on. At this time, the second and third control signals C2 and C3 are interrupted (or have an inactive state) to turn-off the second and third switches SW2 and SW3 (providing a disconnected state). Thus, the first negative pulse NP1 may be applied from the first negative power supply 285n to the chuck 210 through the first switch SW1 and the output terminal 288 during the negative pulse duration ND.

The first controller 282 provides the third control signal C3 with an active state to the third switch SW3 during the stable duration SD. As a result, the third switch SW3 is turned on. At this time, the first and second control signals C1 and C2 have an inactive state to turn-off the first and second switches SW1 and SW2 (providing a disconnected state). Thus, the ground voltage may be applied from the first ground source 283 to the chuck 210 through the third switch SW3 and the output terminal 288 during the stable duration SD.

The first controller 282 provides the second control signal C2 with an active state to the second switch SW2 during the positive pulse duration PD, so the second switch SW2 is turned on. At this time, the first and third control signals C1 and C3 have an inactive state to turn-off the first and third switches SW1 and SW3 (providing a disconnected state). Thus, the first positive pulse PP1 may be applied from the first positive power supply 285p to the chuck 210 through the second switch SW2 and the output terminal 288 during the positive pulse duration PD.

The first controller 282 provides the third control signal C3 with an active state to the third switch SW3 during the pulse-off duration FD, so the third switch SW3 is turned on. At this time, the first and second control signals C1 and C2 have an inactive state to turn-off the first and second switches SW1 and SW2. Thus, the ground voltage may be applied from the first ground source 283 to the chuck 210 through the third switch SW3 and the output terminal 288 during the pulse-off duration FD.

In addition, a second DC pulse signal may be applied to the outer ring 230, as described above. The period of the second DC pulse signal may be equal to the period T of the first DC pulse signal. The first and second DC pulse signals are applied to the chuck 210 and the outer ring 230 at the same time. The second DC pulse signal may be synchronized with the first DC pulse signal. The second DC pulse signal will be described in more detail with reference to FIGS. 5A and 5B.

Figure 5A:
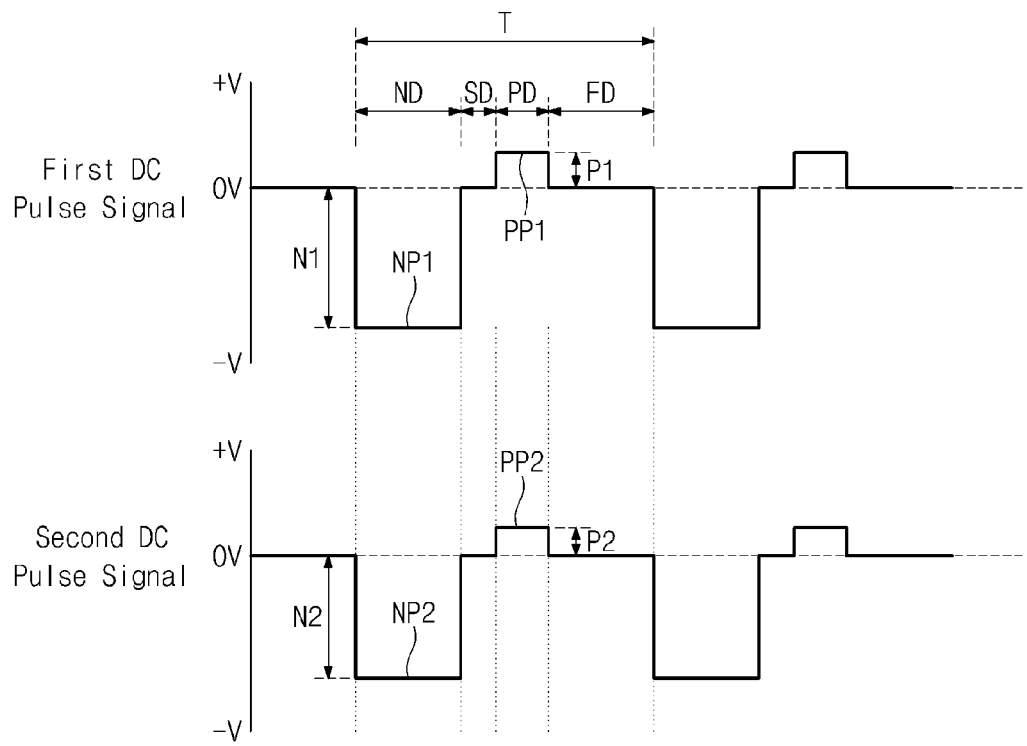
FIG. 5A is a graph illustrating the first DC pulse signal that may be applied to a chuck of the plasma apparatus of FIG. 1 and a second DC pulse signal that may be applied to an outer ring of the plasma apparatus of FIG. 1.
Figure 5B:
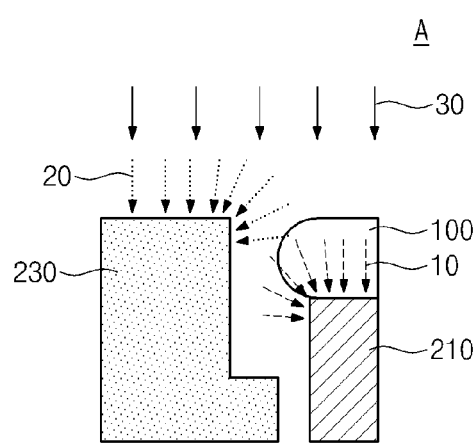
FIG. 5B is an enlarged view of a portion 'A' of FIG. 1.

FIG. 5A is a graph illustrating the first DC pulse signal applied to the chuck and a second DC pulse signal applied to an outer ring in the plasma apparatus of FIG. 1. FIG. 5B is an enlarged view of a portion 'A' of FIG. 1. Like the first DC pulse signal, the second DC pulse signal may comprise a one or more DC pulses over a period T and may be repetitively generated and applied every period T.

Referring to FIGS. 1, 5A, and 5B, the second DC pulse signal may apply a second negative pulse NP2 to the outer ring 230 during the negative pulse duration ND. The second DC pulse signal may apply a second positive pulse PP2 to the outer ring 230 during the positive pulse duration PD. The second DC pulse signal may apply the ground voltage to the outer ring 230 during the stable duration SD and the pulse-off duration FD.

Since the second DC pulse signal is applied to the outer ring 230, an electric field concentrated at an edge of the loaded substrate 100 may be relieved to improve a process uniformity (e.g., an uniformity of an etch rate) of the loaded substrate 100.

If the second DC pulse signal is not applied to the outer ring 230, as illustrated by the broken (or dashed line) arrows 20 of FIG. 5B, a first electric field 10 may be concentrated at the edge of the loaded substrate 100 while the first negative pulse NP1 is applied to the chuck 210. Thus, an intensity of an electric field at the edge of the loaded substrate 100 may be greater than an intensity of an electric field at a center portion of the loaded substrate 100. As a result, an etch rate at the edge of the loaded substrate 100 may be higher than an etch rate at the center portion of the loaded substrate 100. In other words, the etch rate of the loaded substrate 100 may be non-uniform. However, according to embodiments of the inventive concepts, the second DC pulse signal synchronized with the first DC pulse signal can be applied to the outer ring 230. Thus, the second negative pulse NP2 is applied to the outer ring 230 while the first negative pulse NP1 is applied to the chuck 210. A second electric field 20 is generated extending toward the outer ring 230 by virtue of the second negative pulse NP2. The second electric field 20 may relieve at least a portion of the first electric field 10 concentrated at the edge of the loaded substrate 100. Thus, the electric field of the edge of the loaded substrate 100 may be generated more uniformly, as shown by the unbroken arrows 30 of FIG. 5B, thereby reducing the etch rate of the edge of the loaded substrate 100. As a result, a uniformity of the etch rate of the loaded substrate 100 may be improved.

In some embodiments, a magnitude N2 of the second negative pulse NP2 may be different from the magnitude N1 of the first negative pulse NP1, and/or a magnitude P2 of the second positive pulse PP2 may be different from the magnitude P1 of the first positive pulse PP1. In this case, the second DC pulse signal may be applied to the outer ring 230 by the second DC power generator 290. The second DC power generator 290 may be synchronized with the first DC power generator 280, so the first and second DC pulse signals may be outputted at the same time. The second DC power generator 290 will be described in detail with reference to FIG. 6.

Figure 6:
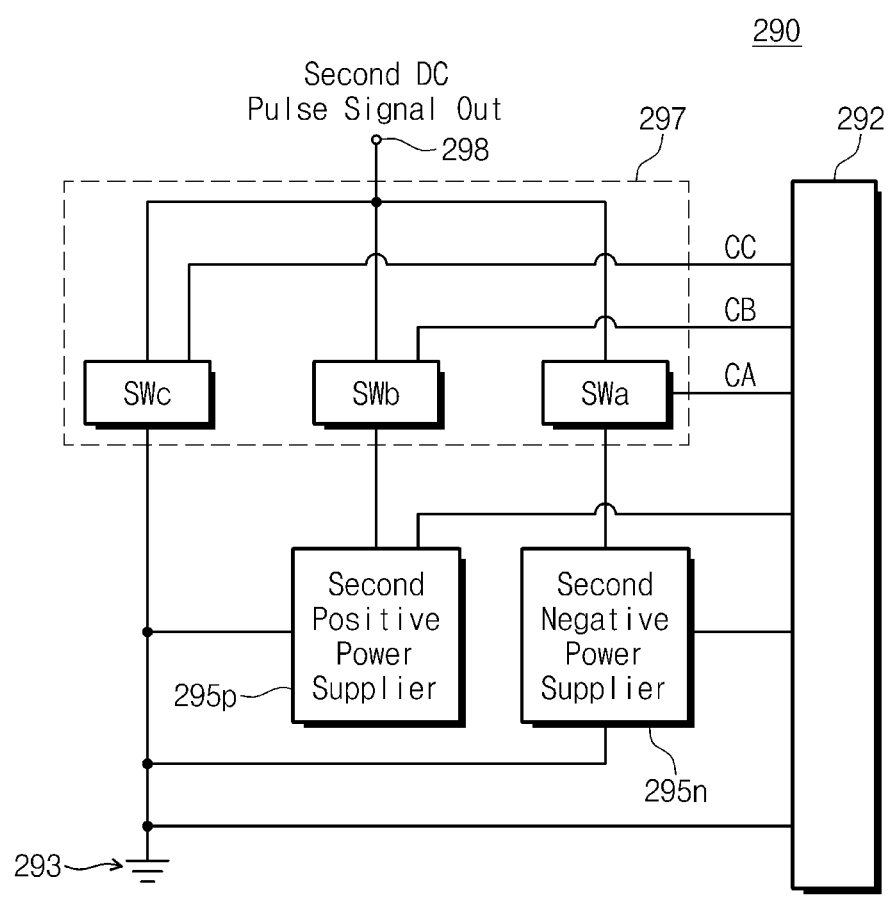
FIG. 6 is a schematic diagram illustrating an embodiment of a second DC power generator that may be included in the plasma apparatus of FIG. 1.

FIG. 6 is a schematic diagram illustrating an embodiment of the second DC power generator included in the plasma apparatus of FIG. 1.

Referring to FIGS. 1, 5A, and 6, the second DC power generator 290 may include a second negative power supply 295n generating the second negative pulse NP2, a second positive power supply 295p generating the second positive pulse PP2, and a second pulse modulator 297 controlling output times of the second negative pulse NP2 and the second positive pulse PP2. In addition, the second DC power generator 290 may further include a second ground source 293 and a second controller 292. The second ground source 293 may generate the ground voltage, and the second controllers 292 may control operations of the supplies 295n and 295p and the second pulse modulator 297.

In some embodiments, the second pulse modulator 297 may include first, second and third switches SWa, SWb and SWc. First terminals of the first, second, and third switches SWa, SWb and SWc may be connected to the second negative power supply 295n, the second positive power supply 295p, and the second ground source 293, respectively. Second terminals of the first, second and third switches SWa, SWb, and SWc may be connected to an output terminal 298 of the second pulse modulator 297. The second controller 292 may provide the first, second and third switches SWa, SWb and SWc with first, second and third control signals CA, CB and CC to output the second DC pulse signal through the output terminals 298. An operating method of the second DC power generator 290 may be the same as the operating method of the first DC power generator 280 described with reference to FIGS. 3 and 4.

In other embodiments, the magnitude N2 of the second negative pulse NP2 may be equal to the magnitude N1 of the first negative pulse NP1, and the magnitude P2 of the second positive pulse PP2 may be equal to the magnitude P1 of the first positive pulse PP1. In other embodiments, the first pulse modulator 287 and second pulse modulator 297 may share structure, such as sharing their positive power supply and/or their negative power supply.

Figure 7:
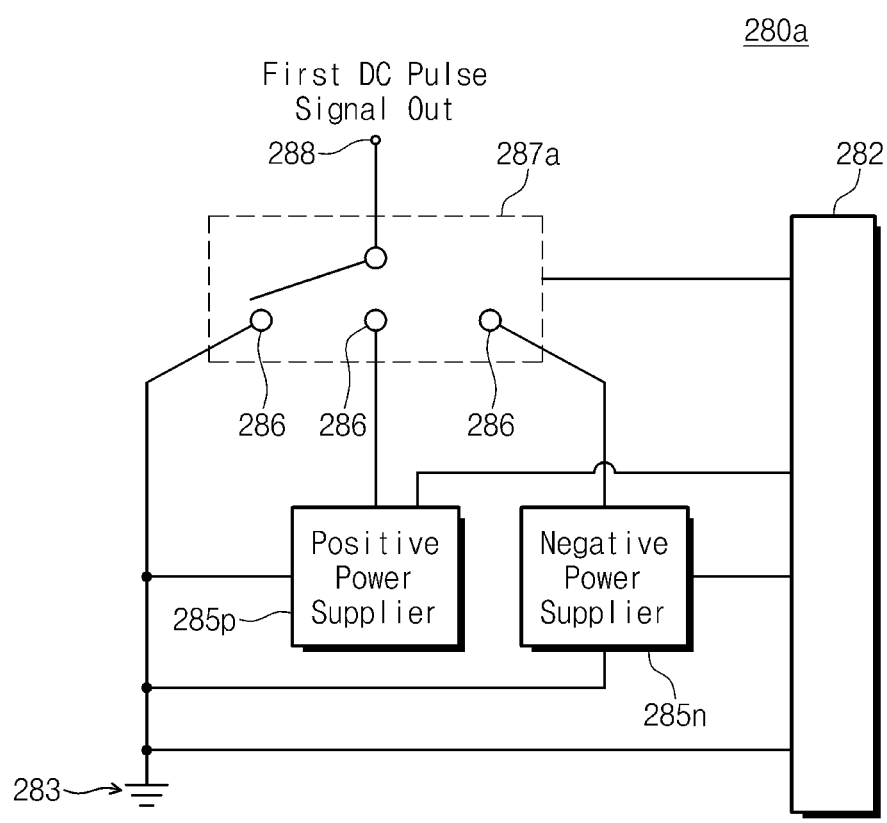
FIG. 7 is a schematic diagram illustrating an embodiment of a first DC power generator included in the plasma apparatus of FIG. 1.

FIG. 7 is a schematic diagram illustrating another embodiment of a first DC power generator that may be included in the plasma apparatus of FIG. 1.

Referring to FIG. 7, a first pulse modulator 287a of a first DC power generator 280a may have a switch structure having four terminals. In more detail, the first DC power generator 280a may include one output terminal 288 and three selection input terminals 286. The three selection input terminals 286 may be connected to the first negative power supply 285n, the first positive power supply 285p, and the first ground source 283, respectively. The first pulse modulator 287a may be selectively switched to one of the selection input terminals 286 by a control signal of the first controller 282, thereby outputting the first DC pulse signals having the durations ND, SD, PD and FD of FIG. 2. Other elements of the first DC power generator 280a may be the same as corresponding ones of the first DC power generator 280 of FIG. 3.

In other embodiments, the second pulse modulator 297 of the second DC power generator 290 of FIG. 6 may have the same structure as the first pulse modulator 287a.

Figure 8:
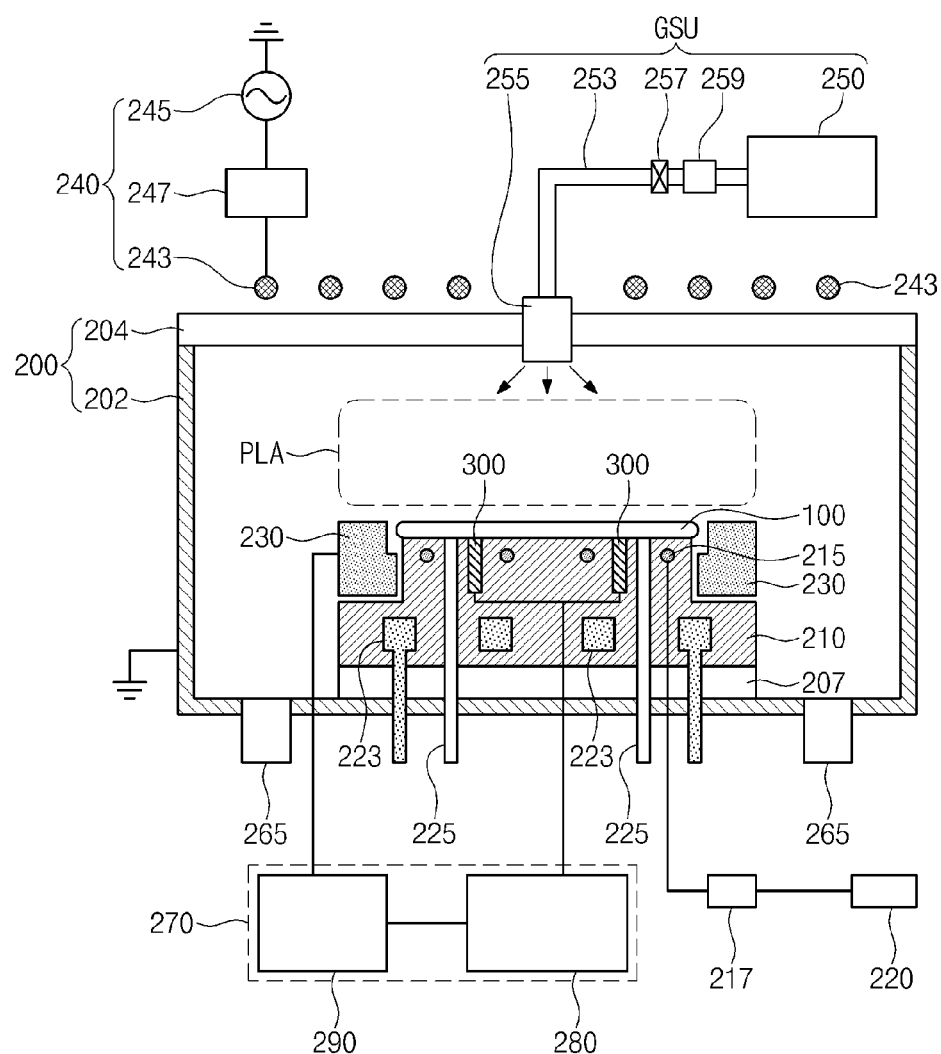
FIG. 8 is a schematic diagram illustrating a plasma apparatus according to other embodiments of the inventive concepts.

FIG. 8 is a schematic diagram illustrating a plasma apparatus according to other embodiments of the inventive concepts. In the present embodiment, the descriptions to the same elements as described in the aforementioned embodiments will be omitted or mentioned briefly for the purpose of ease and convenience in explanation.

Referring to FIG. 8, in a plasma apparatus 191 according to the present embodiment, the chuck 210 may further include at least one conductive pin 300. The conductive pin 300 may be disposed within the chuck 210. The conductive pin 300 may be in contact with the loaded substrate 100. The first DC power generator 280 may be electrically connected to the conductive pin 300. Thus, the first DC power generator 280 may apply the first DC pulse signal to the loaded substrate 100 through the conductive pin 300. In addition, the first DC power generator 280 may also be electrically connected to the chuck 210.

Figure 9:
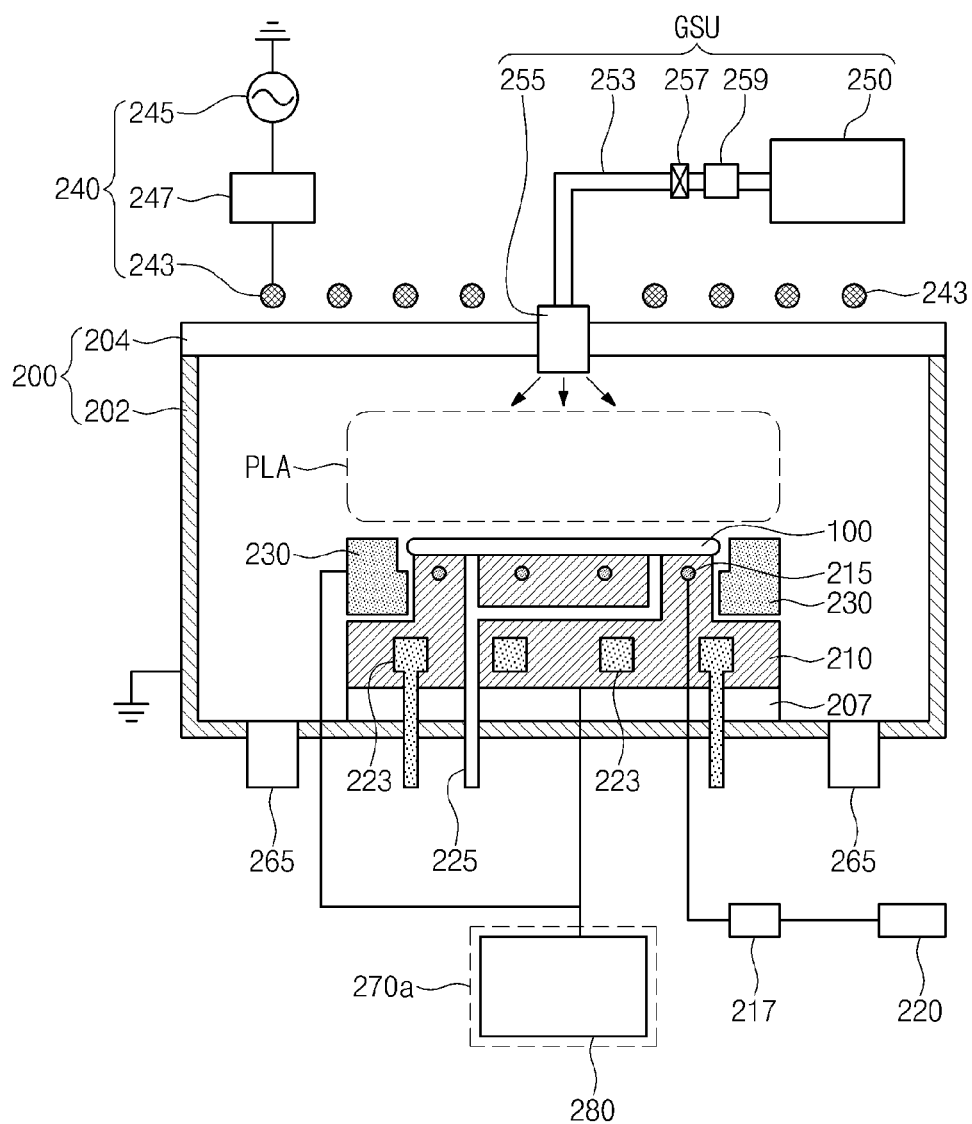
FIG. 9 is a schematic diagram illustrating a plasma apparatus according to still other embodiments of the inventive concepts.

FIG. 9 is a schematic diagram illustrating a plasma apparatus according to still other embodiments of the inventive concepts. In the present embodiment, the descriptions to the same elements as described in the aforementioned embodiments will be omitted or mentioned briefly for the purpose of ease and convenience in explanation.

Referring to FIG. 9, a DC power generating unit 270*a* may have one DC power generator 280 in a plasma apparatus 192 according to the present embodiment. The one DC power generator 280 may apply the first DC pulse signal and the second DC pulse signal to the chuck 210 and the outer ring 230, respectively. In this case, the magnitude of the first negative pulse of the first DC pulse signal may be equal to the magnitude of the second negative pulse of the second DC pulse signal, and the magnitude of the first positive pulse of the first DC pulse signal may be equal to the magnitude of the second positive pulse of the second DC pulse signal. Alternatively, such first and second negative pulses may differ and/or such first and second positive pulses may differ by providing a circuit (not shown) to step down (lower) the relevant voltage supplied to the chuck 210 or outer ring 230.

To facilitate application of the second DC pulse signal to the outer ring 230, at least a portion of the outer ring 230 may be formed of a conductive material. In some embodiments, an entire portion of the outer ring 230 may be formed of a conductive material. In this case, a protecting layer may be formed on an exposed surface of the outer ring 230. The protecting layer may protect the surface of the outer ring 230 from the plasma PLA during the plasma process. Alternatively, the protecting layer may be omitted. The protecting layer may be formed of, for example, an insulating material (e.g., yttrium oxide and/or aluminum oxide). Alternatively, the protecting layer may be omitted.

In other embodiments, only a portion of the outer ring 230 may be formed of a conductive material. In other words, the outer ring 230 may include a portion formed of a conductive material and another portion formed of an insulating material. This will be described with reference to FIGS. 10A, 10B, and 10C.

Figure 10A:
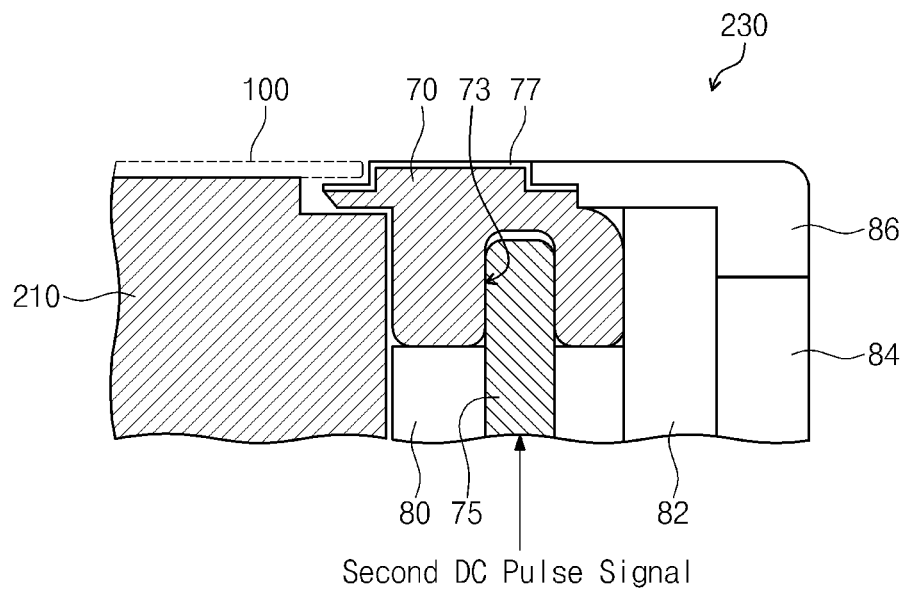
FIG. 10A is an enlarged view illustrating an embodiment of an outer ring that may be included in a plasma apparatus illustrated in FIG. 1.

FIG. 10A is an enlarged view illustrating an embodiment of an outer ring included in a plasma apparatus illustrated in FIG. 1.

Referring to FIG. 10A, an outer ring 230 according to some embodiments may include a conductive ring 70 that is formed of a conductive material. For example, the conductive ring 70 may be formed of a metal (e.g., aluminum). The second DC pulse signal may be provided to the conductive ring 70, and thus, the electric field concentrated at the edge of the substrate 100 may be relieved. An edge portion of the loaded substrate 100 may be spaced apart from the conductive ring 70.

The conductive ring 70 may be disposed on a supporting part 80. The conductive ring 70 may have a first sidewall adjacent to the chuck 210 and a second sidewall opposite to the first sidewall. The conductive ring 70 may be spaced apart from the chuck 210. In some embodiments, the conductive ring 70 may have a protrusion extending onto a top surface of an edge portion of the chuck 210. In some embodiments, the top surface of the edge portion of the chuck 210 may be lower than a top surface of a central portion of the chuck 210. The protrusion of the conductive ring 70 may be disposed on the lower top surface of the edge portion of the chuck 210. The protrusion of the conductive ring 70 may be spaced apart from the chuck 210.

Alternatively, the first sidewall of the conductive ring 70 may be in contact with the chuck 210. In this case, the portion, which is in contact with the conductive ring 70, of the chuck 210 may be formed of an insulating material, so the conductive ring 70 may be electrically insulated from the chuck 210.

At least a portion of the supporting part 80 may be formed of an insulating material. For example, the supporting part 80 may include at least one of aluminum oxide (e.g., $Al_2O_3$) and yttrium oxide (e.g., $Y_2O_3$). In some embodiments, the supporting part 80 may consist of a plurality of parts. Alternatively, the supporting part 80 may be in one united body. The shape of the supporting part 80 is not limited to the shape illustrated in FIG. 10A and may assume other shapes.

A direct current (DC) transmitting conductor 75 may be connected to the conductive ring 70. The DC transmitting conductor 75 may penetrate the supporting part 80 disposed under the conductive ring 70. The DC pulse signal may be applied to the conductive ring 70 through the DC transmitting conductor 75. The DC transmitting conductor 75 may be electrically connected to the DC power generator 280 illustrated in FIG. 9 or the second DC power generator 290 illustrated in FIG. 1 or 8.

In some embodiments, the conductive ring 70 may include a concave region 73, and the DC transmitting conductor 75 may be inserted into the concave region 73. The DC transmitting conductor 75 may be in contact with at least a portion of an inner surface of the concave region 73 of the conductive ring 70. In some embodiments, the DC transmitting conductor 75 may have a pin shape. However, the inventive concepts are not limited thereto. In other embodiments, the DC transmitting conductor 75 may have a bar shape or a linear shape when viewed from a plan view. The DC transmitting conductor 75 may be formed of, for example, a metal (e.g., aluminum).

An inner side insulator 82 may cover the second sidewall of the conductive ring 70. The second sidewall of the conductive ring 70 may be protected from the plasma PLA by the inner side insulator 82 during the plasma process. The inner side insulator 82 may extend downward to cover one sidewall of the supporting part 80. The inner side insulator 82 may have an inner sidewall adjacent to the conductive ring 70 and the supporting part 80 and an outer sidewall opposite to the inner sidewall. The inner side insulator 82 may include at least one of, for example, aluminum oxide (e.g., $Al_2O_3$) and yttrium oxide (e.g., $Y_2O_3$).

An outer side insulator 84 may cover at least a portion of the outer sidewall of the inner side insulator 82. For example, the outer side insulator 84 may cover a lower portion of the outer sidewall of the inner side insulator 82. The outer side insulator 84 may include at least one of, for example, aluminum oxide (e.g., $Al_2O_3$) and yttrium oxide (e.g., $Y_2O_3$).

An insulating ring 86 may be disposed on a top surface of the outer side insulator 84. In some embodiments, the insulating ring 86 may cover an upper portion of the outer sidewall of the inner side insulator 82. In addition, the insulating ring 86 may extend to cover a top surface of the inner side insulator 82. Furthermore, the insulating ring 86 may further extend to cover a portion of the conductive ring 70. Thus, the conductive ring 70 may be fixed by the insulating ring 86. The insulating ring 86 may be formed of, for example, quartz.

A protecting layer 77 may be formed on a top surface of the conductive ring 70. The protecting layer 77 may protect the top surface of the conductive ring 70 from the plasma PLA during the plasma process. The protecting layer 77 may be formed by a coating method. In some embodiments, the protecting layer 77 may extend to be disposed between the conductive ring 70 and the insulating ring 86. In some embodiments, the protecting layer 77 may be formed of an insulating material. For example, the protecting layer 77 may include at least one of aluminum oxide (e.g., $Al_2O_3$) and yttrium oxide (e.g., $Y_2O_3$). The edge portion of the substrate 100 may be spaced apart from the protecting layer 77.

Figure 10B:
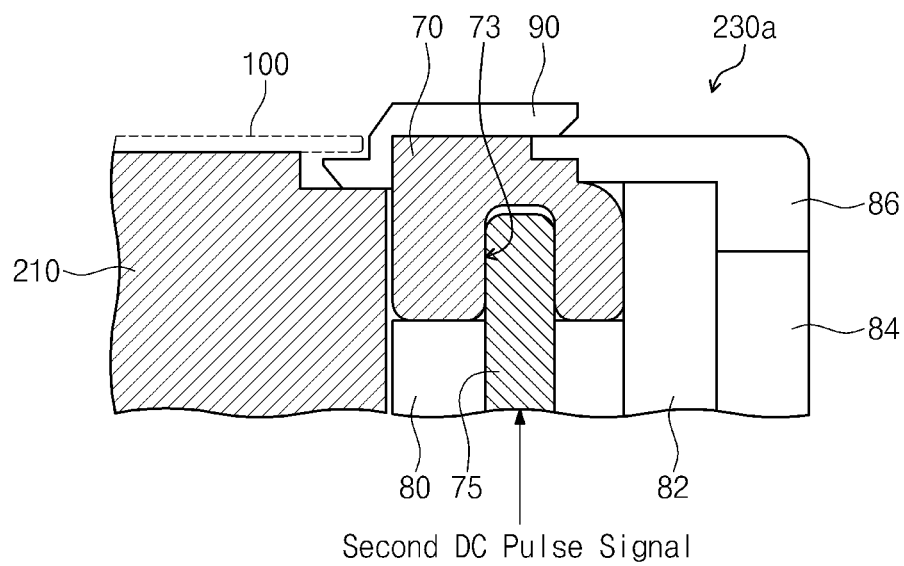
FIG. 10B is an enlarged view illustrating an embodiment of an outer ring that may be included in a plasma apparatus illustrated in FIG. 1.

FIG. 10B is an enlarged view illustrating an embodiment of an outer ring included in a plasma apparatus illustrated in FIG. 1.

Referring to FIG. 10B, an outer ring 230a according to the present embodiment may include a cover ring 90 instead of the protecting layer 77 of FIG. 10A. The cover ring 90 may cover a top surface of the conductive ring 70. The cover ring 90 may protect the top surface of the conductive ring 70 from the plasma PLA during the plasma process. In some embodiments, the cover ring 90 may be formed of an insulating material. For example, the cover ring 90 may be formed of quartz. In some embodiments, a portion of the cover ring 90 may be disposed on the top surface of the edge portion of the chuck 210. The cover ring 90 may be configured to be detachable from the outer ring 230a. Thus, the cover ring 90 may be replaced with new one if the cover ring 90 is damaged by the plasma. In the present embodiment, the conductive ring 70 may not include the protrusion illustrated in FIG. 10A.

Other elements of the outer ring 230a may be the same as corresponding ones of the outer ring 230 of FIG. 10A.

Figure 10C:
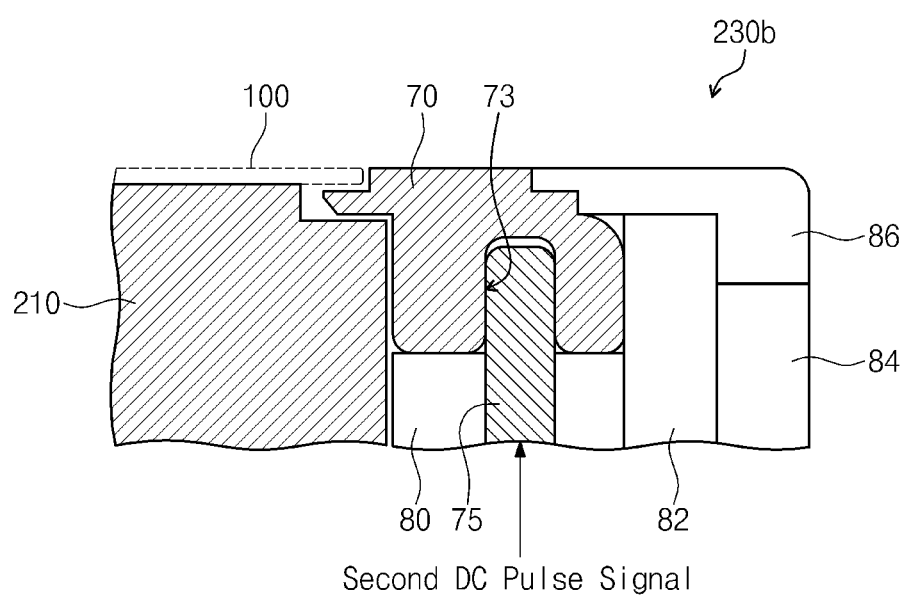
FIG. 10C is an enlarged view illustrating an embodiment of an outer ring that may be included in a plasma apparatus illustrated in FIG. 1.

FIG. 10C is an enlarged view illustrating an embodiment of an outer ring included in a plasma apparatus illustrated in FIG. 1.

Referring to FIG. 10C, an outer ring 230b according to the present embodiment may not include the protecting layer 77 of FIG. 10A. In other words, the conductive ring 70 of the outer ring 230b may have an exposed top surface. Other elements of the outer ring 230b may be the same as corresponding ones of the outer ring 230 of FIG. 10A.

The outer rings 230, 230a, and 230b of FIGS. 10A, 10B, and 10C may be applied to the plasma apparatus 191 of FIG. 8 or the plasma apparatus 192 of FIG. 9.

Next, methods of fabricating semiconductor devices will be described with reference to the drawings.

FIGS. 11 to 19 are cross-sectional views illustrating a method of fabricating a semiconductor device according to some embodiments of the inventive concepts.

Figure 11:
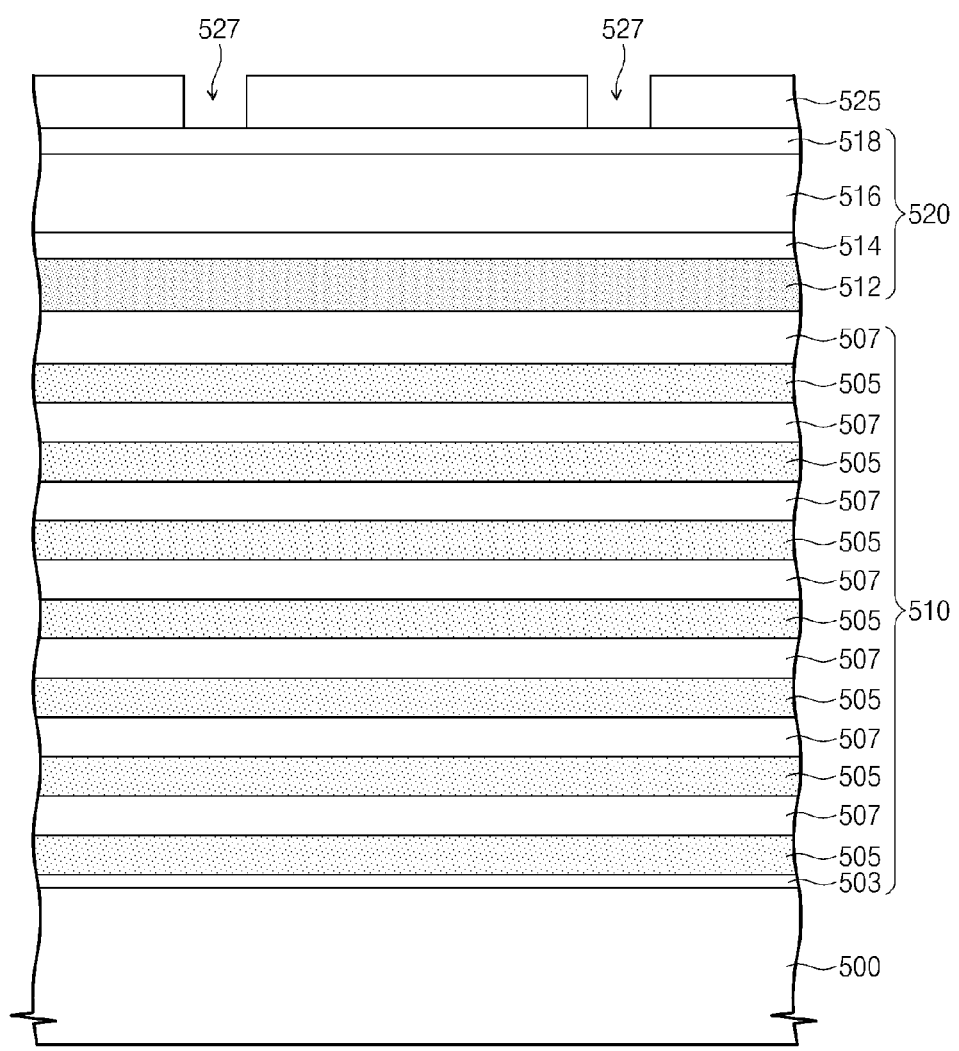
FIGS. 11 to 19 are cross-sectional views illustrating a method of fabricating a semiconductor device according to some embodiments of the inventive concepts.

Referring to FIG. 11, a mold layer 510 may be formed on a substrate 500. The mold layer 510 may include first layers 505 and second layers 507 that are alternately and repeatedly stacked on the substrate 500. The first layers 505 may be formed of a material having an etch selectivity with respect to the second layers 507. For example, the second layers 507 may be formed of silicon oxide layers, and the first layers 505 may be formed of silicon nitride layers. The mold layer 510 may further include a buffer insulating layer 503 formed between the substrate 500 and a lowermost one of the first layers 505. The buffer insulating layer 503 may be formed of a silicon oxide layer.

A hard mask layer 520 may be formed on the mold layer 510. The hard mask layer 520 may have a single-layered structure or a multi-layered structure. In some embodiments, the hard mask layers 520 may include first to fourth hard mask layers 512, 514, 516 and 518 that are sequentially stacked on the mold layer 510. The first hard mask layer 512 may be formed of a material having an etch selectivity with respect to the second layers 507. For example, the first hard mask layer 512 may be formed of a silicon layer (e.g., an amorphous silicon layer). The second hard mask layer 514 may be formed of a silicon oxide layer. The third hard mask layer 516 may function as a main hard mask layer. For example, the third hard mask layer 516 may be formed of an amorphous carbon layer. The fourth hard mask layer 518 may function as an anti-reflection layer. For example, the fourth hard mask layer 518 may be formed of a silicon oxynitride layer.

A photoresist pattern 525 having openings 527 may be formed on the hard mask layer 520 by performing a photolithography process. The openings 527 may expose portions of the hard mask layer 520, respectively.

Figure 12:
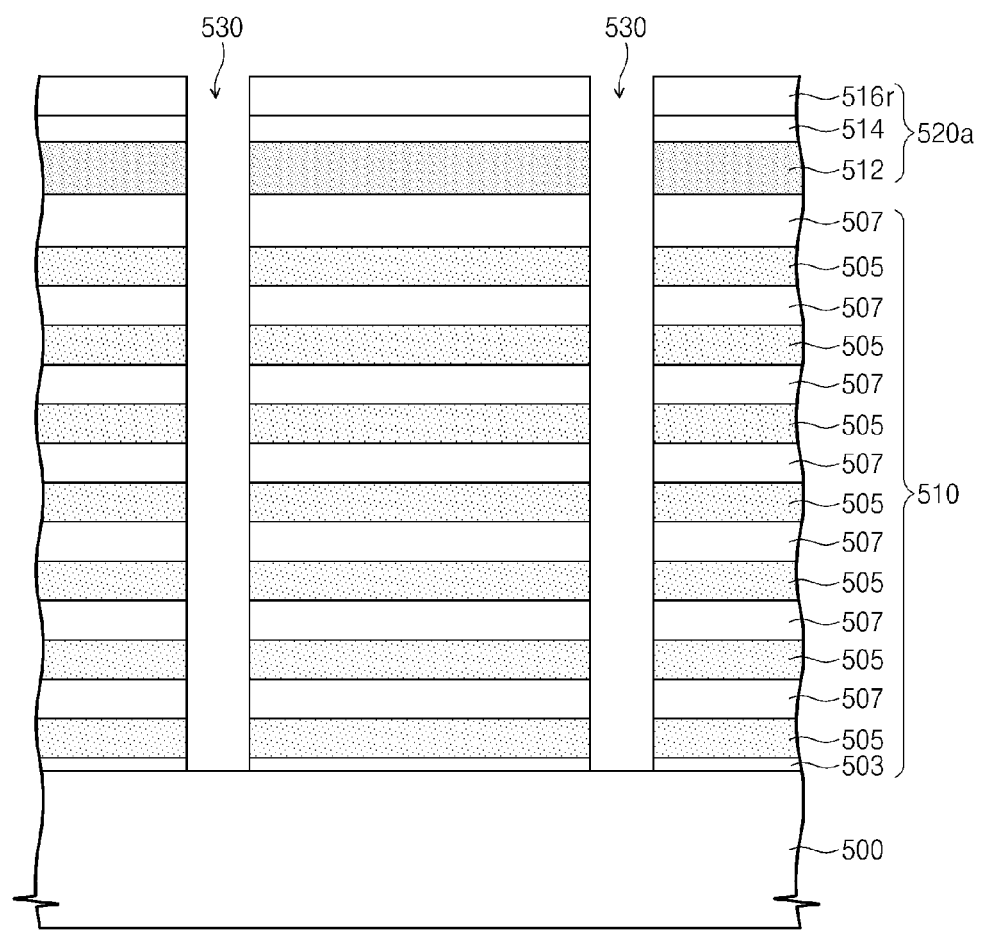

Referring to FIG. 12, the hard mask layer 520 may be etched using the photoresist pattern 525 as an etch mask to expose portions of the mold layer 510. Subsequently, the mold layer 510 may be etched using the hard mask layer 520 as an etch mask to form vertical holes 530 exposing the substrate 500. In some embodiments, a remaining photoresist pattern 525 may be removed after etching the hard mask layer 520 and before etching the mold layer 510. In other embodiments, the remaining photoresist pattern 525 may be removed during the formation of the vertical holes 530.

The process of etching the mold layer 510 may be performed using one of the plasma apparatuses 190, 191 and 192 described above. In this case, the mold layer 510 may correspond to an etch target layer. The process of etching the mold layer 510 using the plasma apparatus 190 of FIG. 1 will be described as an example hereinafter.

Referring to FIGS. 1 and 12, the substrate 500 having the mold layer 510 may be loaded on the top surface of the chuck 210. A process gas (e.g., an etch gas) may be supplied into the process chamber 200 by the gas supply unit GSU. For example, the process gas may include at least one of $CF_4$, $C_4F_6$, $C_4F_8$, COS, $CHF_3$, HBr, $SiCl_4$, $O_2$, $N_2$, $H_2$, $NF_3$, $SF_6$, He, or Ar. Plasma PLA may be generated in the process chamber 200 by the plasma generating unit 240. For example, CF and/or $CF_2$ (e.g., CF and/or $CF_2$ radicals) may be generated from the process gas as a plasma etchant. The first DC pulse signal may be applied from the first DC power generator 280 to the chuck 210, thereby etching the mold layer 510. In some embodiments, when the mold layer 510 is etched, the second DC pulse signal may be applied to the outer ring 230. After the formation of the vertical holes 530, the substrate 500 may be unloaded from the process chamber 200. The first DC pulse signal and second DC pulse signal may be generated and applied as described with respect to any of the embodiments disclosed herein, for example.

After the formation of the vertical holes 530, a hard mask layer 520a may include the first and second hard mask layers 512 and 514 and a remaining portion 516r of the third hard mask layer.

Figure 13:
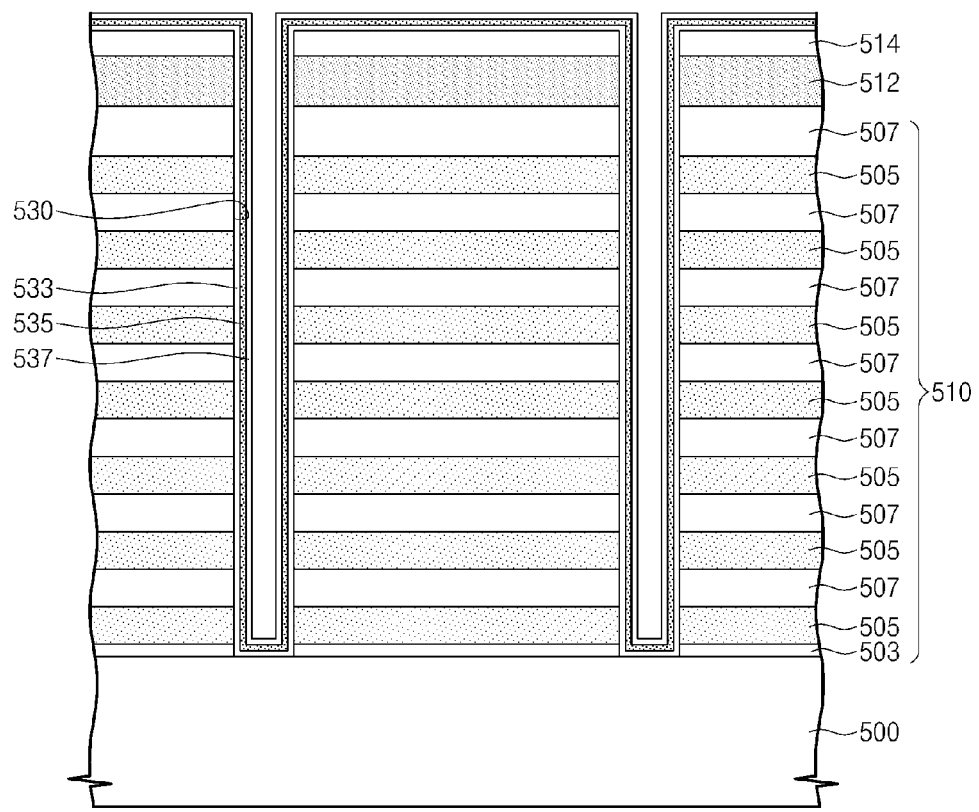

Referring to FIG. 13, the remaining portion 516r of the third hard mask layer may be removed to expose the second hard mask layer 514. Thereafter, a data storage layer 533, a first semiconductor layer 535, and a protection layer 537 may be sequentially formed on the substrate 500. Each of the data storage layer 533, the first semiconductor layer 535, and the protection layer 537 may have a substantially uniform thickness on inner surfaces of the vertical holes 530. The data storage layer 533, the first semiconductor layer 535, and the protection layer 537 may partially fill the vertical hole 530.

In some embodiments, the data storage layer 533 may include a first blocking insulating layer, a charge storage layer, and a tunnel insulating layer which are sequentially stacked. The tunnel insulating layer may be formed of, for example, a silicon oxide layer. The charge storage layer may include a trap insulating layer having trap sites or an insulating layer including conductive nano dots. The first blocking insulating layer may include an insulating material having an energy band gap greater than that of the charge storage layer. For example, the first blocking insulating layer may include a silicon oxide layer.

The first semiconductor layer 535 may be formed of a semiconductor material (e.g., silicon). The first semiconductor layer 535 may be in an amorphous or crystalline state. The first semiconductor layer 535 may be undoped or doped with dopants of the same conductivity type as the substrate 500. The protection layer 537 may protect the first semiconductor layer 535 in a subsequent etching process. The protection layer 537 may include, for example, a silicon oxide layer.

Figure 14:
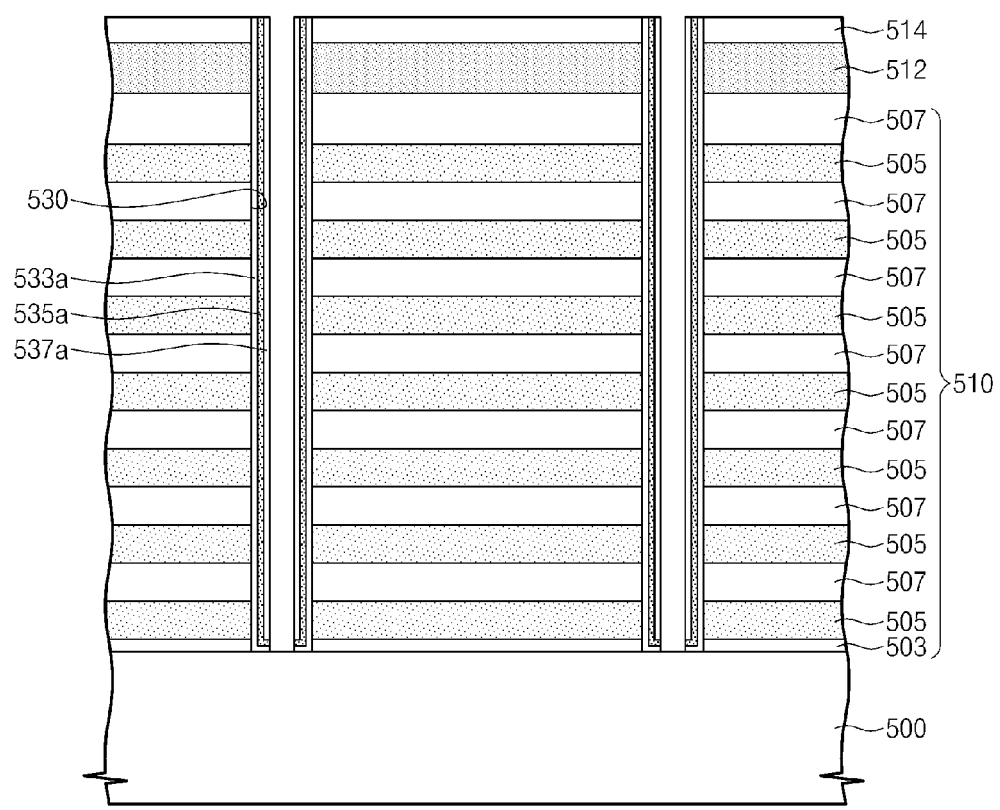

Referring to FIG. 14, the protection layer 537, the first semiconductor layer 535, and the data storage layer 533 may be successively etched to expose the substrate 500. At this time, a data storage pattern 533a, a first semiconductor pattern 535a, and a protection pattern 537a may be sequentially formed on an inner sidewall of the vertical hole 530. Each of the patterns 533a, 535a and 537a may have a cylindrical shape of which a top end and a bottom end are opened.

The process of etching the layers 537, 535 and 533 may be performed by a dry etching process. For example, the process of etching the layers 537, 535 and 533 may be performed using the plasma apparatus 190, 191 or 192 to perform a dry etch according to the aforementioned embodiments of the inventive concepts. In this case, at least one of the layers 537, 535 and 533 may correspond to an etch target layer. The etching process using the plasma apparatus 190 of FIG. 1 will be described as an example hereinafter.

Referring to FIGS. 1, 2, and 14, the substrate 500 having the layers 537, 535 and 533 is loaded on the chuck 210, and an etch gas is then provided into the process chamber 200 by the gas supply unit GSU. Plasma PLA may be generated in the process chamber 200 by the plasma generating unit 240, and the first DC pulse signal may be applied to the chuck 210 (and, in some examples, the substrate 100) by the first DC power generator 280. Thus, the layers 537, 535 and 533 may be etched. In some embodiments, since the protection layer 537 is formed of a different material from the first semiconductor layer 535 and the first semiconductor layer 535 is formed of a different material from the data storage layer 533, another kind of an etch gas may be supplied to etch the first semiconductor layer 535 after the protection layer 537 is etched. Subsequently, still another kind of an etch gas may be supplied to etch the data storage layer 533.

The layers 537, 535 and 533 disposed on a bottom surface of the vertical hole 530 are disposed in a narrow space (i.e., the vertical hole 530) and are lower than the layers 537, 535 and 533 disposed on the second hard mask layer 514. Thus, it may be difficult to etch the layers 537, 535 and 535 disposed on the bottom surface of the vertical hole 530. However, according to embodiments of the inventive concepts, the layers 537, 535 and 533 on the bottom surface of the vertical hole 530 may be more easily etched by applying the first DC pulse signal to the chuck 210. In addition, the magnitude of the positive pulse PP1 and/or the pulse-off duration FD may be controlled to increase the amount of remaining portions of the first and second hard mask layers 512 and 514. In other words, the amount of etch by-products (e.g., polymers) on the hard mask layers 512 and 514 may be increased by controlling the magnitude of the positive pulse PP1 and/or the pulse-off duration FD. The etch by-products may cause a passivation effect. As a result, the layers 537, 535 and 533 on the bottom surface of the bottom surface of the vertical hole 530 may be more easily etched (with more passivating by-products removed from the vertical hole 530), but the amount of the remaining portions of the hard mask layers 512 and 514 may be increased to improve a margin of the etching process.

An experiment was performed to confirm an effect obtained by the pulse-off duration FD. A first sample and a second sample were prepared for the experiment. Each of the first and second samples was fabricated to include a mold layer formed on a substrate, a vertical hole penetrating the mold layer, and first to third layers conformally formed in the vertical hole and on the mold layer. The first, second, and third layers were a silicon oxide layer, a liner poly-silicon layer, and a silicon oxide layer, respectively. An upper portion of the mold layer was formed of a mask poly-silicon layer. The first to third layers of the first sample were etched by a first anisotropic etching process using a conventional RF back bias, but the first to third layers of the second sample were etched by a second anisotropic etching process using the first DC pulse signal of the inventive concepts. Thicknesses of the mask poly-silicon layers of the first and second samples were substantially equal to each other before the first and second anisotropic etching processes. All the vertical holes of the first and second samples were opened after the first and second anisotropic etching processes. A thickness of a remaining portion of the mask poly-silicon layer of the first sample was about 780 Å after the first anisotropic etching process. On the other hand, a thickness of a remaining portion of the mask poly-silicon layer of the second sample was about 1460 Å after the second anisotropic etching process. In other words, the remaining portion of the mask poly-silicon layer of the second sample using the first DC pulse signal of the inventive concepts was thicker than the remaining portion of the mask poly-silicon layer of the first sample using the conventional RF back bias. This is understood to result from an increase in the amount of etch by-products on the mask poly-silicon layer due to the pulse-off duration FD of the first DC pulse signal according to embodiments of the inventive concepts.

In addition, the second DC pulse signal may be applied to the outer ring 230 when the first DC pulse signal is applied to the chuck 210. Thus, the etch uniformity of the etching process may be improved.

The substrate 500 may be unloaded from the process chamber 200 after the layers 537, 535 and 533 are etched to form the patterns 537a, 535a and 533a.

Figure 15:
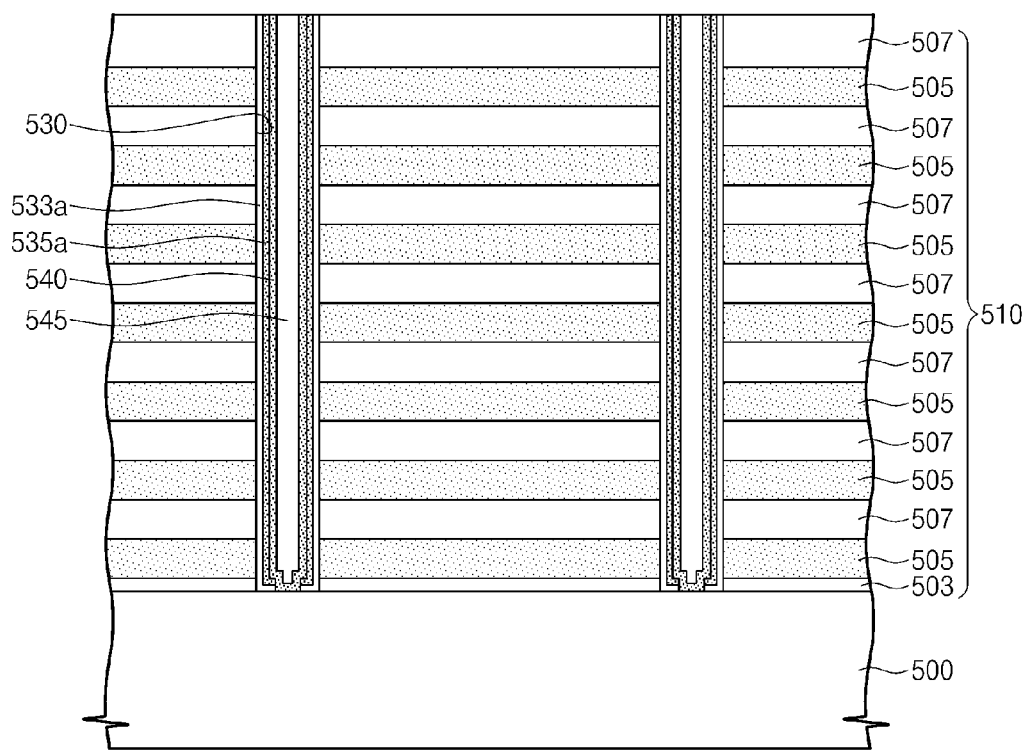

Referring to FIG. 15, the protection pattern 537a may be removed by an isotropic etching process (e.g., a wet etching process). Thus, the first semiconductor pattern 535a may be exposed.

A second semiconductor layer may be conformally formed on the substrate 500, and a filling insulation layer may be formed on the second semiconductor layer to fill the vertical hole 530. The filling insulation layer and the second semiconductor layer may be planarized to form a second semiconductor pattern 540 and a filling insulation pattern 545 in the vertical hole 530. When the filling insulation layer and the second semiconductor layer are planarized, the second and first hard mask layers 514 and 512 may be planarized and be then removed. The second semiconductor pattern 540 may be connected to the first semiconductor pattern 535a and the substrate 500. Thus, the first semiconductor pattern 535a may be electrically connected to the substrate 500 through the second semiconductor pattern 540. The first and second semiconductor patterns 535a and 540 may constitute a vertical channel pattern.

Figure 16:
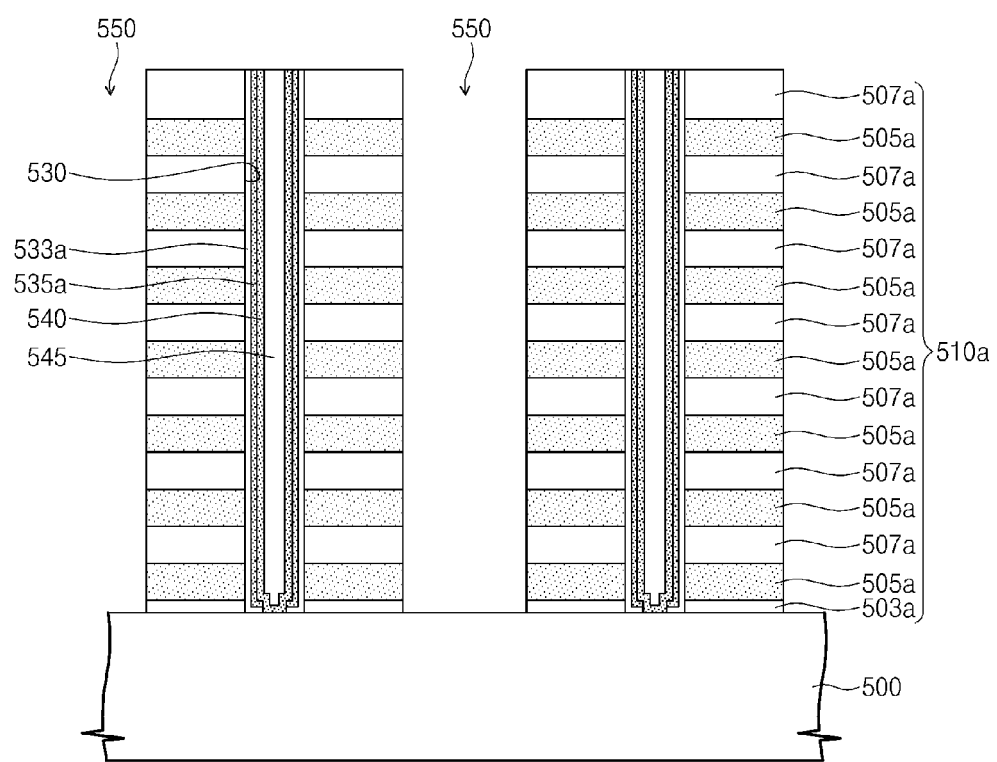

Referring to FIG. 16, the mold layer 510 may be patterned to form trenches 550 and a mold pattern 510a between the trenches 550. An etching process included in the patterning process of the mold layer 510 may be performed using one of the plasma apparatuses 190, 191 and 192 and/or associated processes described above. The mold pattern 510a may include first patterns 505a and second patterns 507a which are alternately and repeatedly stacked. In addition, the mold pattern 510a may further include a buffer insulating pattern 503a disposed between the substrate 500 and a lowermost one of the first patterns 505a. The trenches 550 may expose sidewalls of the first and second patterns 505a and 507a.

Figure 17:
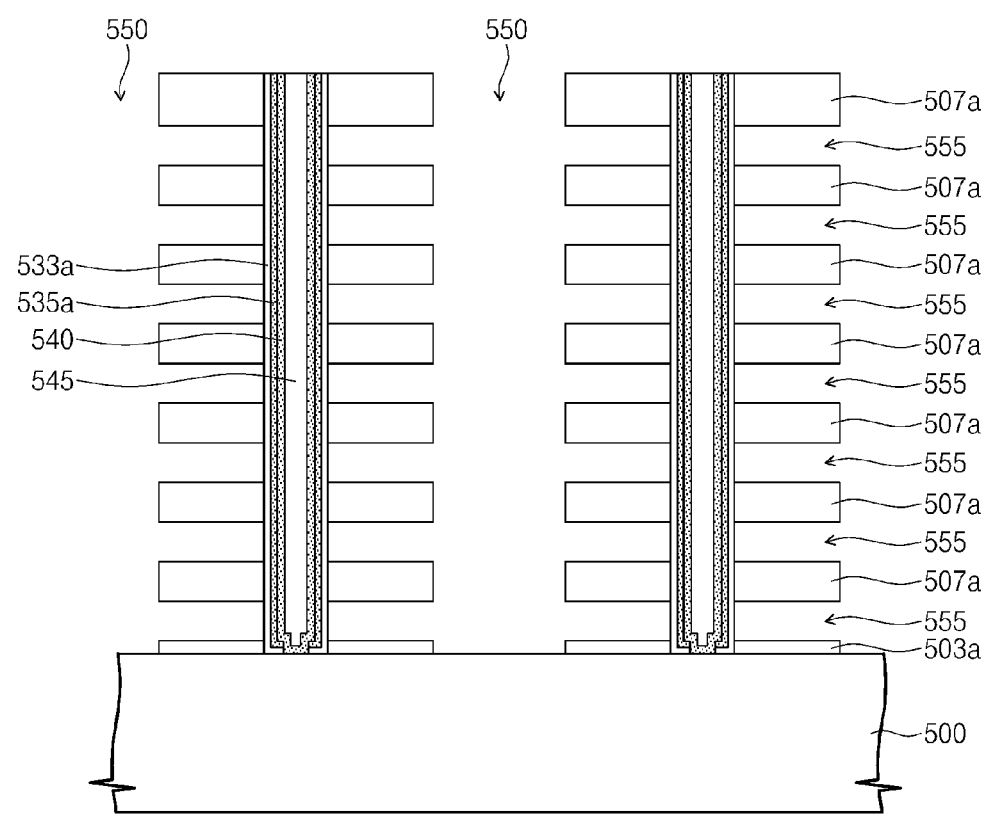

Referring to FIG. 17, the first patterns 505a exposed by the trenches 550 may be removed to form empty regions 555. At this time, the second patterns 507a remain since the first patterns 505a have the etch selectivity with respect to the second patterns 507a. The empty regions 555 may be formed between the second patterns 507a. The first patterns 505a may be removed by an isotropic etching process.

Figure 18:
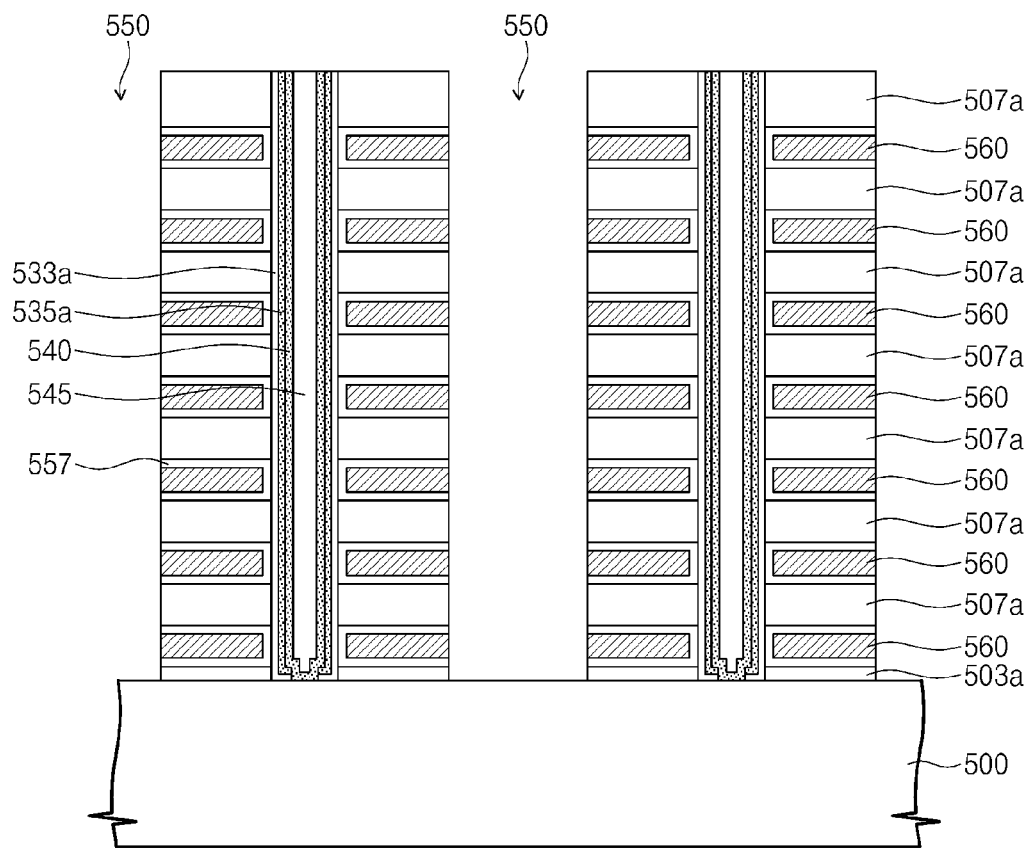

Referring to FIG. 18, a second blocking insulating layer 557 may be conformally formed on inner surfaces of the empty regions 555, and a conductive layer may be formed on the second blocking insulating layer 557. The conductive layer may fill the empty regions 555. The conductive layer outside the empty regions 555 may be removed to form electrode patterns 560 in the empty regions 555, respectively. The electrode patterns 560 may be used as, for example, gate electrodes. The second blocking insulating layer 557 outside the empty regions 555 may also be removed as illustrated in FIG. 18. The electrode patterns 560 may include a doped semiconductor material and/or a metal-containing material (e.g., a metal and/or a conductive metal nitride). The second blocking insulating layer 557 may have a high-k dielectric material having a dielectric constant higher than that of the tunnel insulating layer. For example, the second blocking insulating layer 557 may include an insulating metal oxide such as hafnium oxide and/or aluminum oxide.

Figure 19:
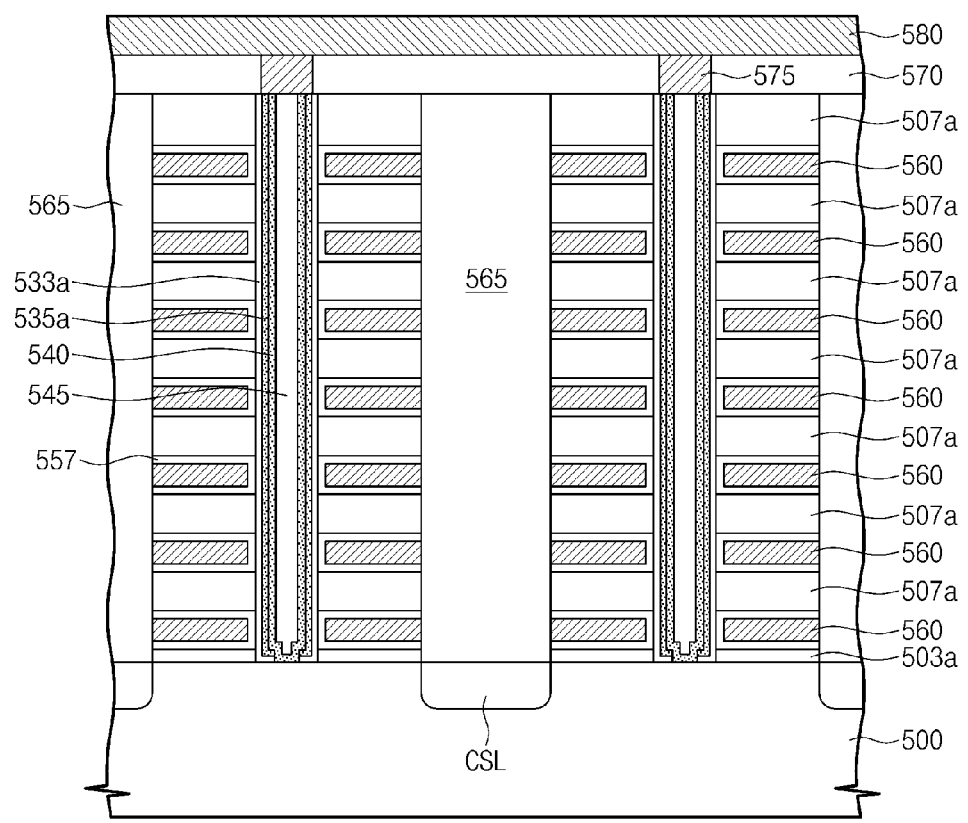

Referring to FIG. 19, dopants may be injected into the substrate 500 under the trenches 550 to form common source regions CSL. Device isolation patterns 565 may be formed to fill the trenches 550, respectively.

An interlayer insulating layer 570 may be formed on the substrate 500, and contact plugs 575 may be formed to penetrate the interlayer insulating layer 570. The contact plugs 575 may be connected to top ends of the vertical channel patterns, respectively. A bit line 580 may be formed on the interlayer insulating layer 570. The bit line 580 may be electrically connected to the top ends of the vertical channel patterns through the contact plugs 575.

FIGS. 20 to 23 are cross-sectional views illustrating a method of fabricating a semiconductor device according to other embodiments of the inventive concepts.

Figure 20:
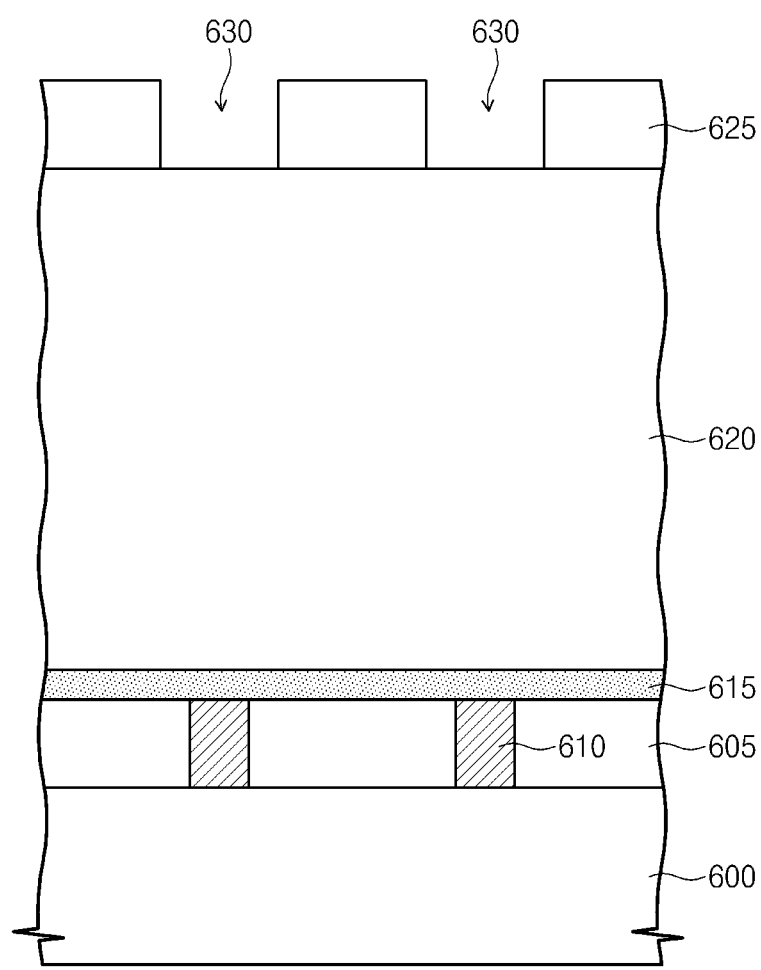
FIGS. 20 to 23 are cross-sectional views illustrating a method of fabricating a semiconductor device according to other embodiments of the inventive concepts.

Referring to FIG. 20, an interlayer insulating layer 605 may be formed on a substrate 600, and contact plugs 610 may be formed to penetrate the interlayer insulating layer 605. An etch stop layer 615 and a mold layer 620 may be sequentially formed on the interlayer insulating layer 605 and the contact plugs 610. The etch stop layer 615 may be formed of an insulating material having an etch selectivity with respect to the mold layer 620. For example, the etch stop layer 615 may be formed of a silicon nitride layer, and the mold layer 620 may be formed of a silicon oxide layer.

A mask layer 625 having openings 630 may be formed on the mold layer 625. The mold layer 620 may correspond to an etch target layer.

Figure 21:
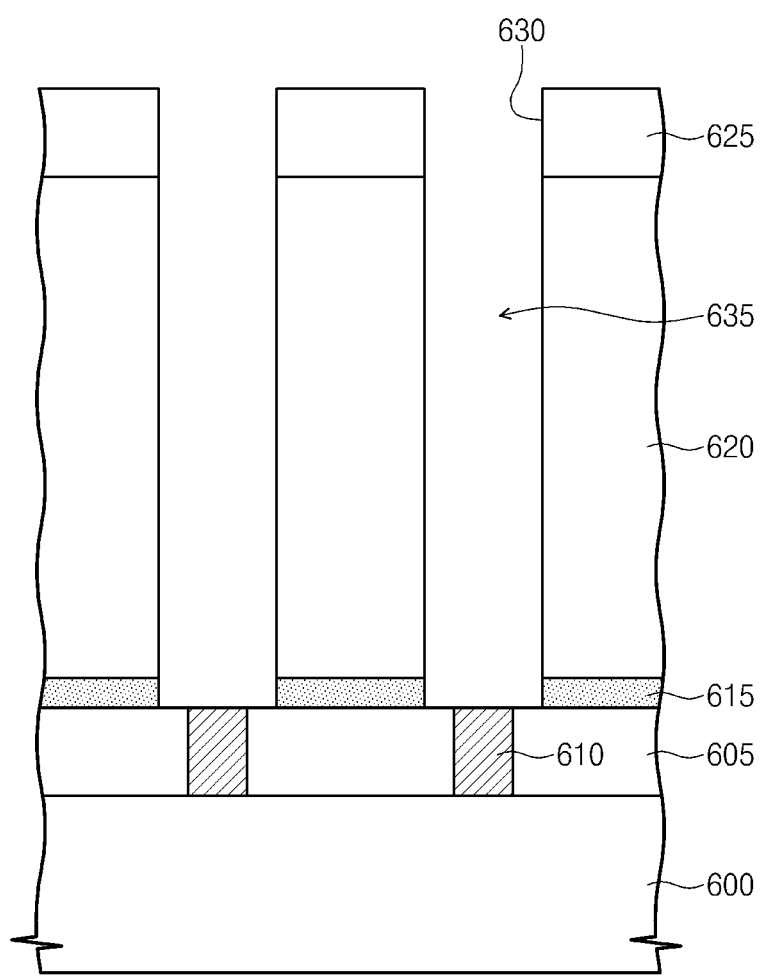

Referring to FIG. 21 the mold layer 620 may be etched using the mask layer 625 as an etch mask to form holes 635. The etching process of the mold layer 620 for the formation of the holes 635 may be performed using one of the plasma apparatuses 190, 191 and 192 described above. After the etching process, the holes 635 may expose the etch stop layer 615. The etch stop layer 615 under the holes 635 may be removed to expose the contact plugs 610.

Figure 22:
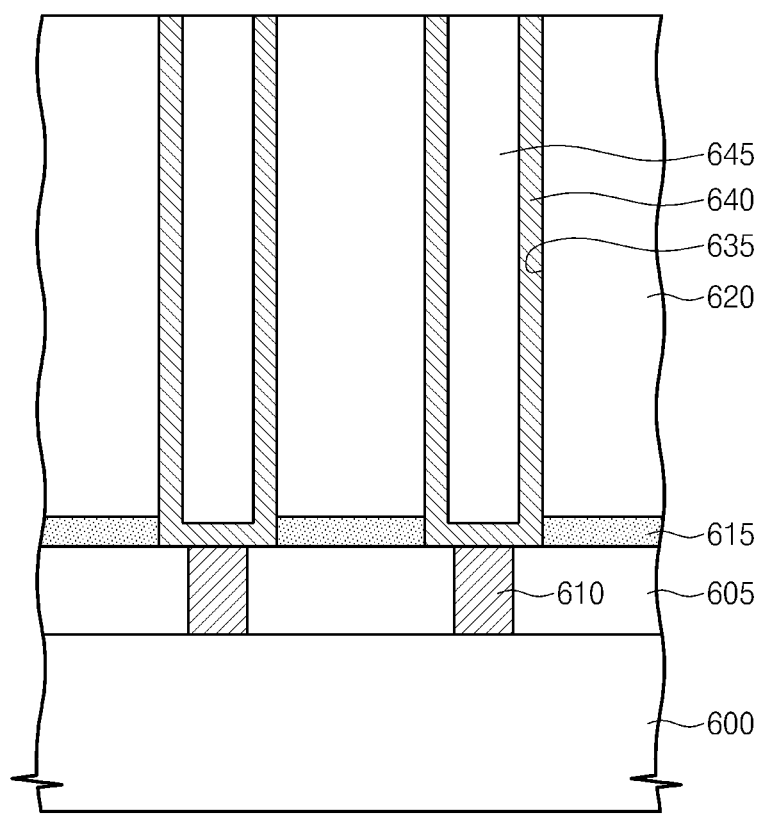

Referring to FIG. 22, the mask layer 625 may be removed. A lower electrode layer may be conformally formed on the substrate 600 having the holes 635. A filling layer may be formed on the lower electrode layer to fill the holes 635. The filling layer and the lower electrode layer may be planarized until the mold layer 620 is exposed, thereby forming a lower electrode 640 and a filling pattern 645 in each of the holes 635. The lower electrode 640 may have a cylindrical shape. Alternatively, the filling layer may be omitted, and the lower electrode layer may fill the holes 635. In this case, the lower electrode 640 may have a pillar-shape.

Figure 23:
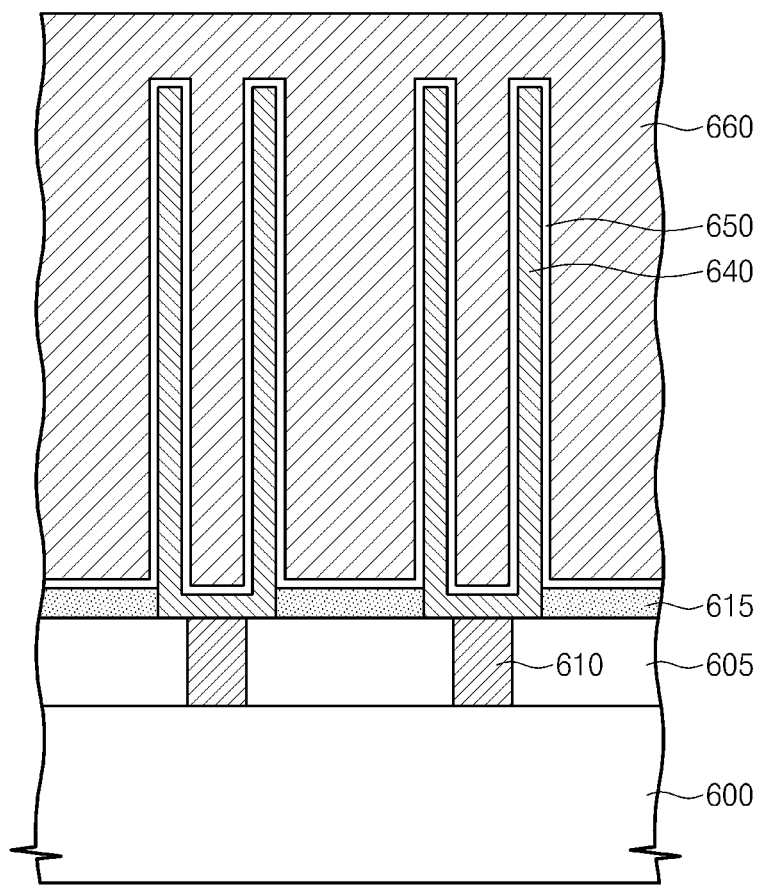

Referring to FIG. 23, the filling patterns 645 and the mold layer 620 may be removed to expose surfaces of the lower electrodes 640. A capacitor dielectric layer 650 may be formed on the exposed surfaces of the lower electrodes 640, and an upper electrode 660 may be formed on the capacitor dielectric layer 650. The upper electrode 660 may covers the surfaces of the lower electrodes 640. The lower and upper electrodes 640 and 660 and the capacitor dielectric layer 650 may constitute a capacitor.

The applications of the plasma apparatuses according to the embodiments described above are not limited to the methods of fabricating the semiconductor devices in the aforementioned embodiments of the inventive concepts. In other embodiments, the plasma apparatuses according to the embodiments may be applied to various semiconductor fabricating processes using plasma.

As described above, the period of the DC pulse signal applied to the chuck includes the negative pulse duration, the positive pulse duration, and the pulse-off duration. The charged substrate may be neutralized by the positive pulse of the positive pulse duration. In addition, the positive pulse of the positive pulse duration may increase the electron temperature to increase the radicals, and thus, the etch rate and/or the etch selectivity ratio may be increased. The etch by-products causing the passivation effect may be formed on the component used as a mask as a result of the pulse-off duration, so that the margin of the etching process may be improved. In addition, the etch by-products in the etch region may effectively escape from the etch region during the pulse-off duration, and thus, the etch rate may be increased and the etch region having or more closely resembling a desired profile may be formed.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A plasma apparatus comprising:
a process chamber having an inner space;
a chuck disposed in the process chamber, the chuck having a top surface configured to load a substrate;
a gas supply unit supplying a process gas into the process chamber;
a plasma generating unit generating plasma over the chuck; and a direct current (DC) power generator configured to apply a DC pulse signal having repetitive periods to the chuck, each period of the DC pulse signal comprising a negative pulse duration during which a negative pulse is applied; a positive pulse duration during which a positive pulse is applied; a stable duration after the negative pulse duration and before the positive pulse duration; and a pulse-off duration, after the positive pulse duration and prior to subsequent application of a negative pulse, during which the negative pulse and the positive pulse are turned off, wherein the direct current (DC) power generator is configured to apply the DC pulse signal in a manner such that the pulse-off duration is longer than the stable duration to allow etch by-products, formed during plasma generation, to escape from an etch region of the substrate.

2. The plasma apparatus of claim 1, wherein a voltage value of the stable duration is between voltage values of the negative pulse and the positive pule.

3. The plasma apparatus of claim 2, wherein the direct current (DC) power generator is configured to apply the DC pulse signal a ground voltage to the chuck during the stable duration and the pulse-off duration.

4. The plasma apparatus of claim 1, wherein a magnitude of the positive pulse is less than a magnitude of the negative pulse.

5. The plasma apparatus of claim 1, wherein the negative pulse duration is longer than the positive pulse duration.

6. The plasma apparatus of claim 1, wherein the DC power generator comprises:
a negative power supply generating the negative pulse;
a positive power supply generating the positive pulse; and
one or more switches configured to connect the negative power supply to supply the negative pulse to the chuck and to connect the positive power supply to supply the positive pulse to the chuck.

7. The plasma apparatus of claim 6, wherein the DC power generator further comprises:
a ground source generating a ground voltage;
wherein the one or more switches are configured to connect the ground source to the chuck.

8. The plasma apparatus of claim 7, wherein the pulse modulator comprises:
a first switch having a first terminal connected to the negative power supply;
a second switch having a first terminal connected to the positive power supply;
a third switch having a first terminal connected to the ground source; and
an output terminal connected to second terminals of the first, second and third switches, and
wherein the first, second and third switches operate in response to first, second and third control signals received from a controller.

9. The plasma apparatus of claim 1, further comprising:
an outer ring disposed on an edge of the chuck and surrounding the loaded substrate,
wherein the outer ring is supplied with a second DC pulse signal.

10. The plasma apparatus of claim 9, wherein the second DC pulse signal has the same period as the DC pulse signal applied to the chuck.

11. The plasma apparatus of claim 1, wherein the chuck comprises: at least one conductive pin disposed within the chuck,
wherein the at least one conductive pin is in contact with the loaded substrate, and
wherein the DC power generator is electrically connected to the at least one conductive pin.

12. A plasma apparatus comprising:
a process chamber having an inner space;
a chuck disposed in the process chamber, the chuck having a top surface configured to load a substrate;
an outer ring disposed at an edge of the chuck, the outer ring configured to surround a loaded substrate;
a gas supply unit supplying a process gas into the process chamber;
a plasma generating unit generating plasma over the chuck; and
a direct current (DC) power generating unit applying a first DC pulse signal to the chuck and a second DC pulse signal to the outer ring,
wherein the first and second DC pulse signals comprise repetitive periods, each period of each of the first and second DC pulse signals comprising: a negative pulse duration followed by a positive pulse duration followed by a pulse-off duration,
wherein the direct current (DC) power generating unit is configured to control the pulse-off duration of each of the first and second DC pulse signals in a manner such that etch by-products, formed during plasma generation, can escape from an etch region of the substrate and be deposited on an upper surface of the substrate,
wherein the first DC pulse signal and the second DC pulse signal comprise a first negative pulse and a second negative pulse, respectively, during the negative pulse duration,
wherein the first DC pulse signal and the second DC pulse signal comprise a first positive pulse and a second positive pulse, respectively, during the positive pulse duration, respectively, and
wherein the first DC pulse signal and the second DC pulse signal each comprise a ground voltage during off during the pulse-off duration, and
wherein the second DC pulse signal comprises lower potential magnitudes than the first DC pulse signal.

13. A plasma apparatus comprising:
a process chamber configured to maintain a plasma;
a chuck within the process chamber, the chuck comprising a surface configured to mount a wafer;
one or more electrodes configured to generate plasma within the chamber; and
a DC voltage generator configured to repetitively generate a first DC signal and apply the first DC signal to the chuck, the first DC signal consisting of a first portion and a second portion,
wherein the first portion consists of a DC signal that is not greater than −500V,
wherein the second portion consists of a DC signal that is equal to or greater than about a ground potential,
wherein a duration of the second portion is greater than a duration of the first portion, and
wherein the DC voltage generator is configured to control the duration of the second portion in a manner such that etch by-products, formed during plasma generation, can escape from an etch region of the wafer and be deposited on an upper surface of the wafer.

14. The plasma apparatus of claim 13, wherein the second portion comprises a positive potential pulse portion and a ground potential portion.

15. The plasma apparatus of claim 13, further comprising a ring comprising a conductive material disposed near a top surface of the chuck to surround the surface configured to mount the wafer.

16. The plasma apparatus of claim 15, wherein the first DC signal is applied to the ring.

17. The plasma apparatus of claim 15, wherein the DC voltage generator is configured to repetitively generate a second DC signal and to apply the second DC potential signal to the ring, the second DC signal being generated in synchronism with the first DC signal.

18. The plasma apparatus of claim 17, wherein the second DC signal comprises different potential magnitudes than the first DC signal.

19. The plasma apparatus of claim 18, wherein second DC signal comprises a third portion and a fourth portion,
wherein the third portion consists of a negative pulse, and
wherein the fourth portion consists of a DC signal that is equal to or greater than about a ground potential.

20. The plasma apparatus of claim 17, wherein the first and second DC signals have waveforms that are substantially the same shape but having different magnitudes for at least some portions of the first and second DC signals.

21. The plasma apparatus of claim 19,
wherein the fourth portion comprises a positive potential pulse portion and a ground potential portion, and
wherein the magnitude of the positive potential pulse portion of the fourth portion is different from the magnitude of the positive potential pulse portion of the second portion.

22. The plasma apparatus of claim 21,
wherein the first portion and the third portion are negative pulses having different magnitudes from each other.

* * * * *